United States Patent
Hsu et al.

(10) Patent No.: US 11,175,452 B1
(45) Date of Patent: Nov. 16, 2021

(54) PHOTONIC DEVICE AND FABRICATION METHOD THEREOF

(71) Applicant: TAIWAN SEMICONDUCTOR MANUFACTURING CO., LTD., Hsinchu (TW)

(72) Inventors: Sui-Ying Hsu, New Taipei (TW); Yueh-Ying Lee, Hsinchu (TW); Chien-Ying Wu, Hsinchu (TW); Chen-Hao Huang, Taoyuan (TW); Chien-Chang Lee, Miaoli County (TW); Chia-Ping Lai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/990,270

(22) Filed: Aug. 11, 2020

(51) Int. Cl.
  *G02B 6/122* (2006.01)
  *G02B 6/12* (2006.01)
  *G02B 6/38* (2006.01)

(52) U.S. Cl.
  CPC ....... *G02B 6/1225* (2013.01); *G02B 6/12009* (2013.01); *G02B 6/3826* (2013.01)

(58) Field of Classification Search
  CPC .............. G02B 6/1225; G02B 6/12009; G02B 6/3826; G02B 2006/12061; G02B 2006/12178
  See application file for complete search history.

(56) References Cited

U.S. PATENT DOCUMENTS 9,864,138 B2 * 1/2018 Coolbaugh ..... H01L 31/022408

* cited by examiner

*Primary Examiner* — John Bedtelyon
(74) *Attorney, Agent, or Firm* — Birch, Stewart, Kolasch & Birch, LLP

(57) ABSTRACT

A method for fabricating a photonic device is provided. The method includes patterning a semiconductor layer to form a waveguide structure, a semiconductor structure connected to the waveguide structure, and a dummy semiconductor structure disconnected from the waveguide structure and the semiconductor structure; epitaxially growing an epitaxial semiconductor feature over the semiconductor structure and a dummy epitaxial semiconductor feature over the dummy semiconductor structure; depositing a first capping film over the epitaxial semiconductor feature and the dummy epitaxial semiconductor feature; depositing a second capping film over the first capping film, wherein an oxide concentration of the second capping film is greater than an oxide concentration of the first capping film; and patterning the first and second capping films to form at least a dummy composite capping layer over the dummy epitaxial semiconductor feature.

20 Claims, 46 Drawing Sheets

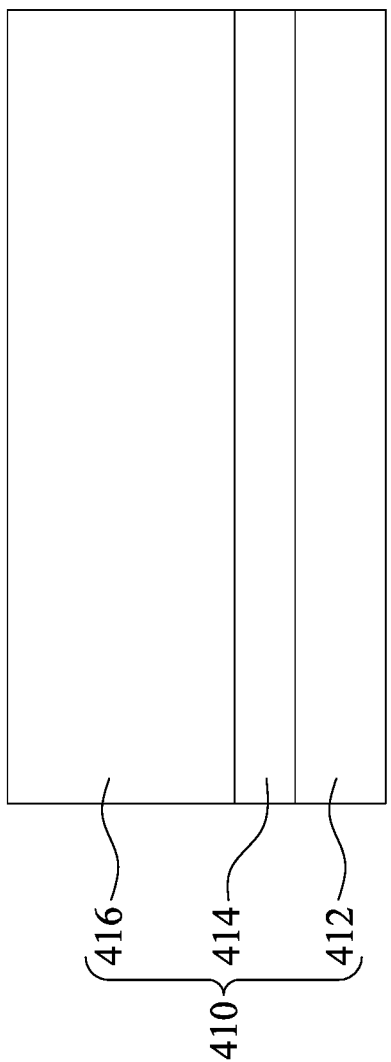

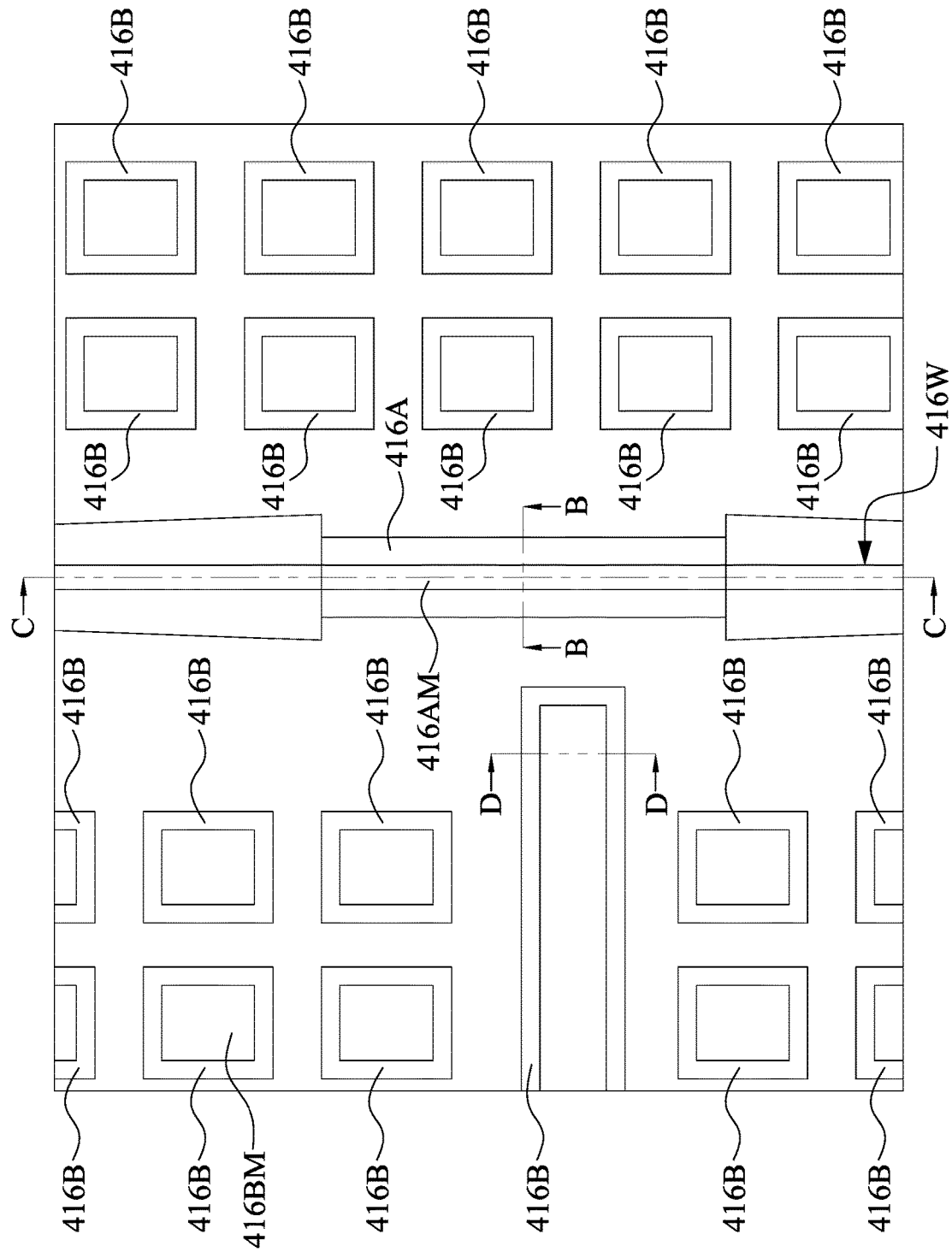

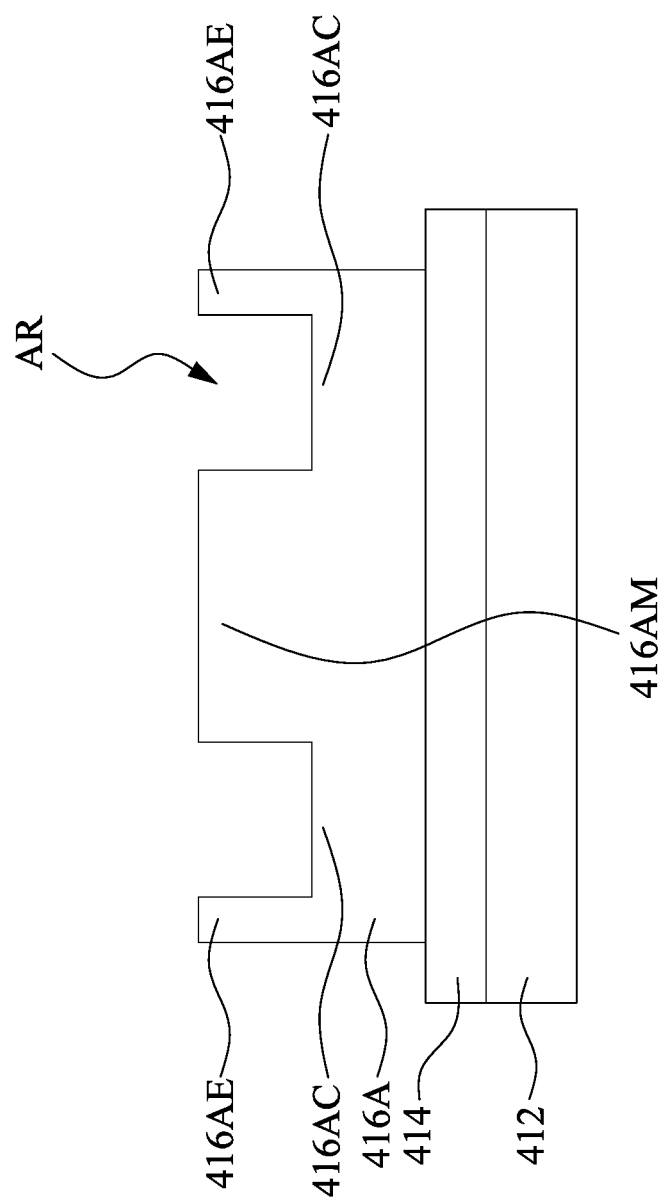

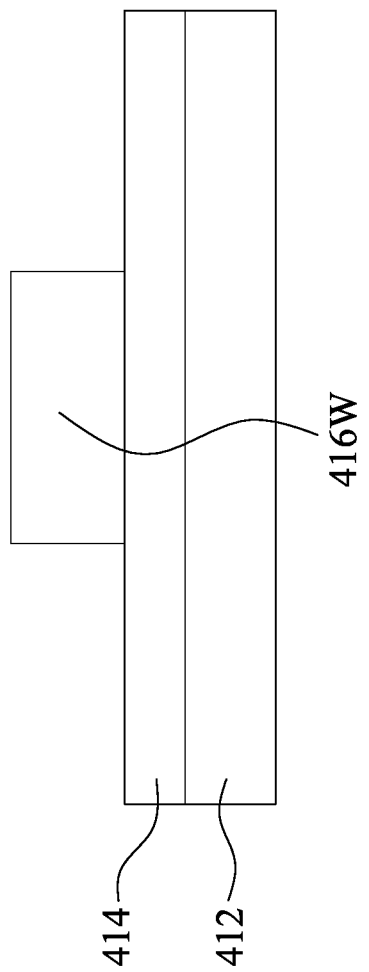

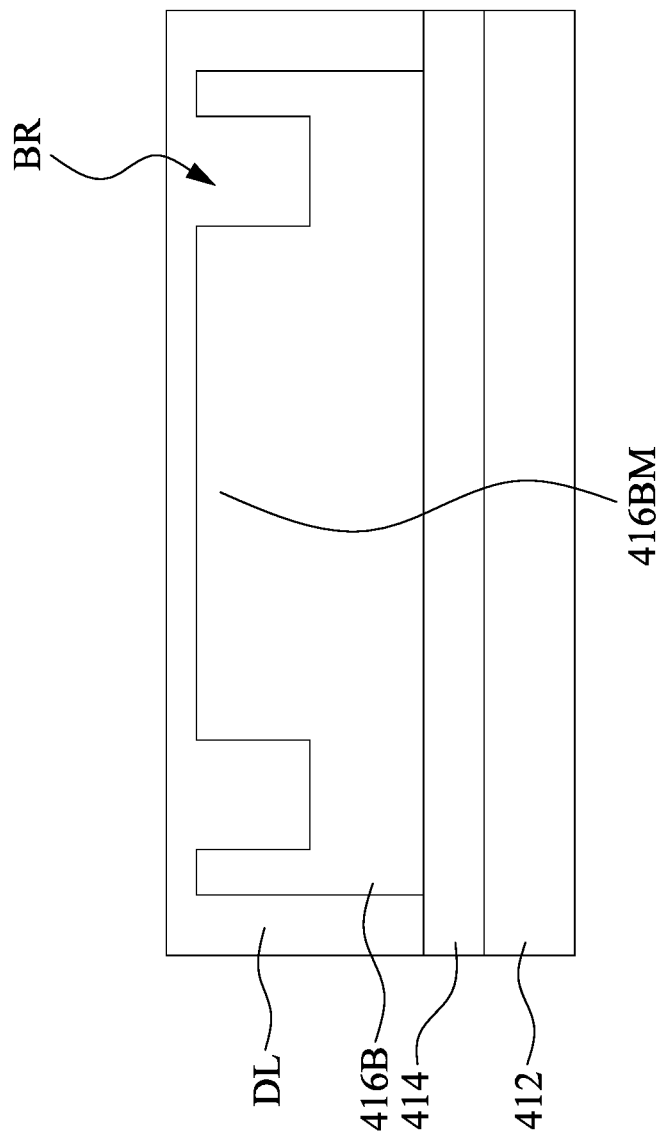

PHOTONIC DEVICE AND FABRICATION METHOD THEREOF

BACKGROUND

In today's telecommunication network, optical fibers are typically chosen over electrical cablings to transmit information in the form of light from one place to another partially because of various advantageous characteristics of the optical fibers, for example, a higher bandwidth, a longer transmission distance, etc., when compared to the electrical cablings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-12B illustrate a method for fabricating a photonic device at various intermediate stages of manufacture according to some embodiments of the present disclosure.

DETAILED DESCRIPTION

Figure 1:
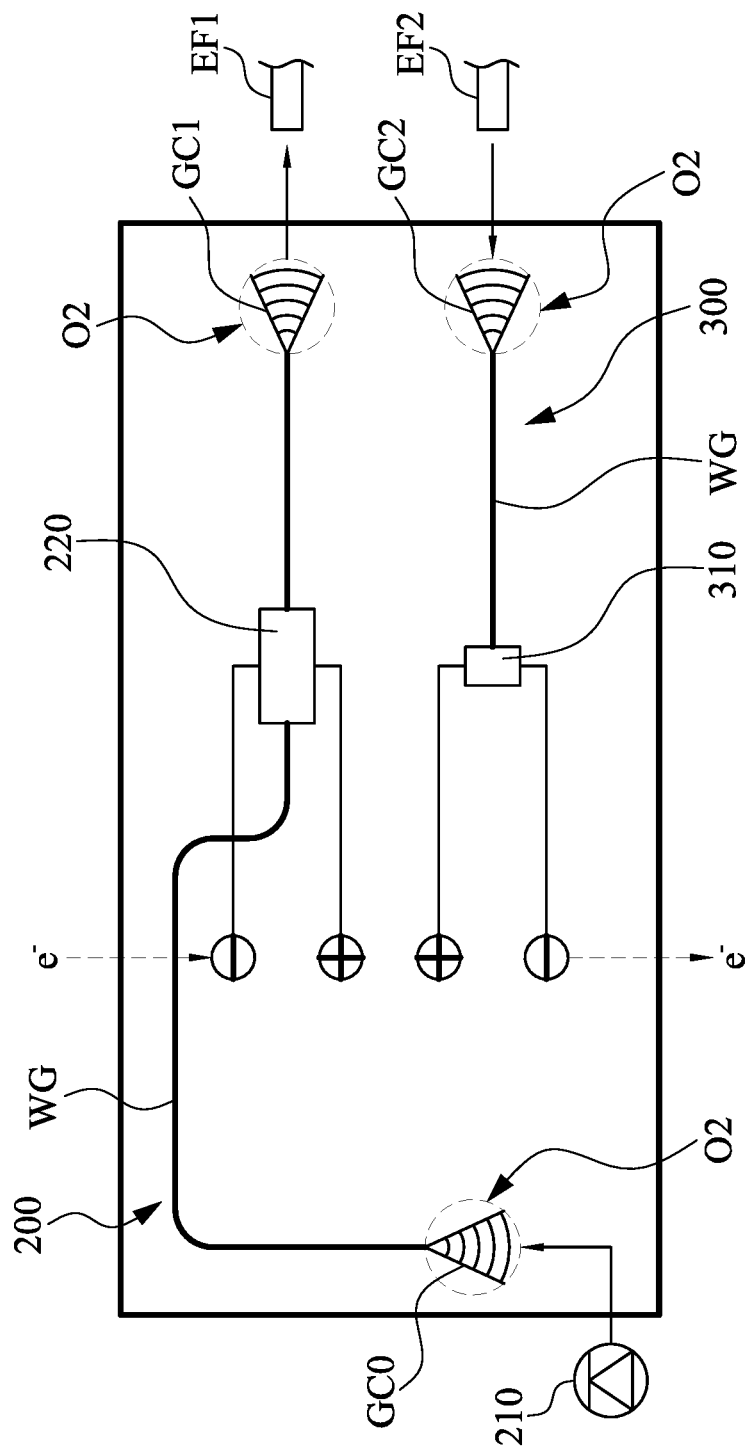
FIG. 1 is a schematic top view of a photonic device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Optical communication is a technique by which data signals can be transmitted from a transmitter to a receiver using optical fiber. An optical transmitter converts an electrical signal into an optical signal, which forms a carrier wave. The carrier wave is modulated with a modulation signal (i.e. the data), and is then transmitted along the optical fiber to a receiver, which converts the optical signal back into an electrical signal and recovers the transmitted data. A photodetector is one of the important components of the receiver and may dictate the performance of a fiber optic communication link. Semiconductor photodiodes are good photodetectors in optical fiber systems since they provide good performance, are compatible with optical fibers (being small in size), and are of relative low cost. For example, semiconductor photodiodes are made from semiconductors, such as silicon or germanium, or from compound semiconductors, such as GaAs, InGaAs, etc.

Semiconductor photodiodes implemented directly on silicon (Si) substrates are desirable to leverage the benefits offered by the silicon-on insulator (SOI) technology. This includes compatibility with silicon (Si) microelectronics facilities, chip-scale device miniaturization and large-scale integration. Despite the lattice mismatch of Ge with Si, thin Ge films can be epitaxially grown on Si substrates. Germanium (Ge), with a cut-off wavelength near ~1.8 µm, is a promising candidate for on-chip photo-detection. In the embodiments of the present disclosure, a semiconductor PIN waveguide photodiode may exemplarily advantageously exploit lateral Silicon/Germanium/Silicon (Si/Ge/Si) heterojunctions. The use of this photodiode architecture benefits from the improved optical confinement in the Ge layer, due to the larger refractive index difference between doped Si regions and the intrinsic Ge region, which in turn, yields a reduction of the optical loss in doped contacts.

A photonic device including semiconductor photodiodes and the methods of forming the same are provided in accordance with some embodiments of the present disclosure. The intermediate stages of manufacturing the photonic device are illustrated. Variations of the embodiments are also discussed. Throughout the various views and illustrative embodiments, like reference numbers are used to designate like elements.

FIG. 1 is a schematic top view of a photonic device 100 according to some embodiments of the present disclosure. The photonic device 100 may be a fiber-optical transceiver including a transmitter path 200 and a receiver path 300. It should be noted that, the transmitter path 200 and the receiver path 300 in FIG. 1 are shown in a simplified manner. Additional components, such as amplifier or switches, may be present in the transmitter path 200 and the receiver path 300 or between the transmitter path 200 and the receiver path 300.

In some embodiments, the transmitter path 200 includes an optical source 210, an optical coupler GC0, a modulator 220, waveguides WG, and an optical coupler GC1. The optical source 210 may be configured to provide an unmodulated light. For example, the optical source 210 may be a laser or other source. In the present embodiments, the optical coupler GC0 receives the unmodulated light from the optical source 210 and directs the unmodulated light into the waveguides WG, thereby sending the unmodulated light toward the modulator 220. The modulator 220 is optically coupled between the optical coupler GC0 and the optical coupler GC1 through the waveguides WG for adjusting the unmodulated light. For example, the modulator 220 is configured to modulate and adjust characteristics (e.g., modes) of the unmodulated light with a modulation signal (i.e. the data). After the modulation, another waveguide WG sends the modulated light signal toward the optical coupler GC1, thereby outputting the modulated light signal from the optical coupler GC1, for example, to an external fiber EF1. Additional component may be optically coupled between the optical coupler GC0 and the optical coupler GC1 through waveguides WG.

The receiver path 300 may include a photodetector 310, waveguides WG, and an optical coupler CG2. In the present embodiments, the photodetector 310 is optically coupled to the optical coupler GC2 through the waveguides WG. Through the configuration, the optical coupler GC2 may receive a light signal (e.g., from an external fiber EF2), and directs the light signal into the waveguides WG, thereby sending the light signal toward the photodetector 310. The photodetector 310 may convert light signals into electrical signals, which can then be amplified and processed. Additional component may be optically coupled between the optical coupler GC2 and the photodetector 310 through waveguides WG.

In some embodiments, the photodetector 310, the optical couplers GC0-GC2, and the waveguides WG may be covered by one or more layers, and plural optical coupler openings O2 are respectively formed in the layers above the optical couplers GC0-GC2 for optical coupling. For example, in some embodiments, light emitted from the optical source 210 is sent to the optical coupler GC0 through the opening O2. In some embodiments, light may exit from the optical coupler GC1 and then be sent to the external fiber EF1 through the opening O2. In some embodiments, light coming from the external fiber EF2 may be sent to the optical coupler GC2 through the opening O2. The optical coupler openings O2 are shown as dashed circles herein for brief illustration. The detail configuration of the optical coupler openings O2 may be referred to the illustration in FIG. 14.

In the present embodiments, the transmitter path 200 and the receiver path 300 in combination form a fiber-optical transceiver on a chip. In some other embodiments, the transmitter path 200 may form a fiber-optical transmitter on one chip, while the receiver path 300 may form a fiber-optical receiver on another chip. The fabricating process of the photodetector 310, at least one of the optical couplers GC0-GC2, and the waveguides WG is exemplarily illustrated below.

FIGS. 2-12B illustrate a method for fabricating a photonic device (e.g., the photonic device 100 in FIG. 1) at various intermediate stages of manufacture according to various embodiments of the present disclosure. For simplicity, some components of the receiver path 300 (referring to FIG. 1) is illustrated, while other components are omitted. The illustration is merely exemplary and is not intended to be limiting beyond what is specifically recited in the claims that follow. It is understood that additional operations may be provided before, during, and after the operations shown by FIGS. 2-12B, and some of the operations described below can be replaced or eliminated for additional embodiments of the method. The order of the operations/processes may be interchangeable.

Reference is made to FIG. 2. A semiconductor substrate 410 is provided. The semiconductor substrate 410 may be a silicon-on-insulator (SOI) substrate including a base substrate 412, an insulator layer 414 over the base substrate 412, and a semiconductor layer 416 over the insulator layer 414. The base substrate 412 may be a bulk substrate, such as bulk silicon substrate. The insulator layer 414 may include silicon oxide or other suitable insulating materials, and/or combinations thereof. In some embodiments, an insulator layer 414 may include a buried oxide layer (BOX) that is grown or deposited overlying the silicon base substrate 412. The semiconductor layer 416 is formed on the insulator layer 414. The semiconductor layer 416 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. For example, the SOI substrates are fabricated using separation by implantation of oxygen (SIMOX), wafer bonding, and/or other suitable methods.

Figure 3C:
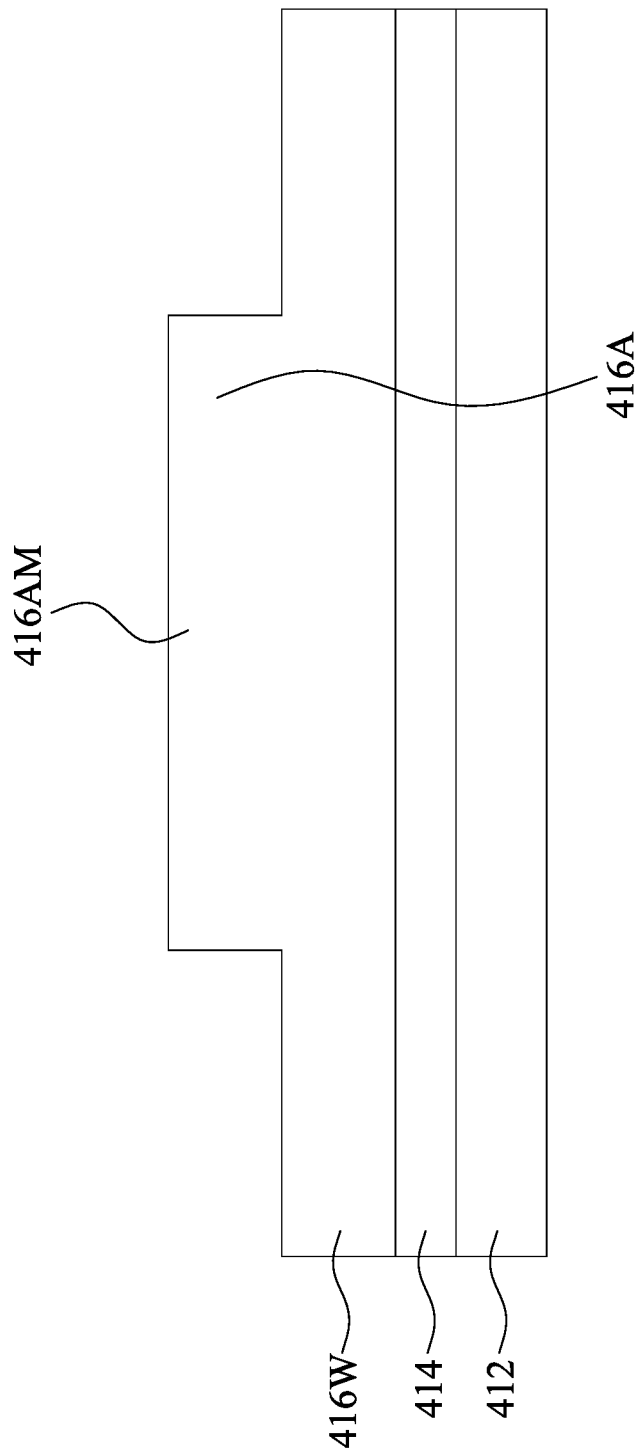
Figure 3D:
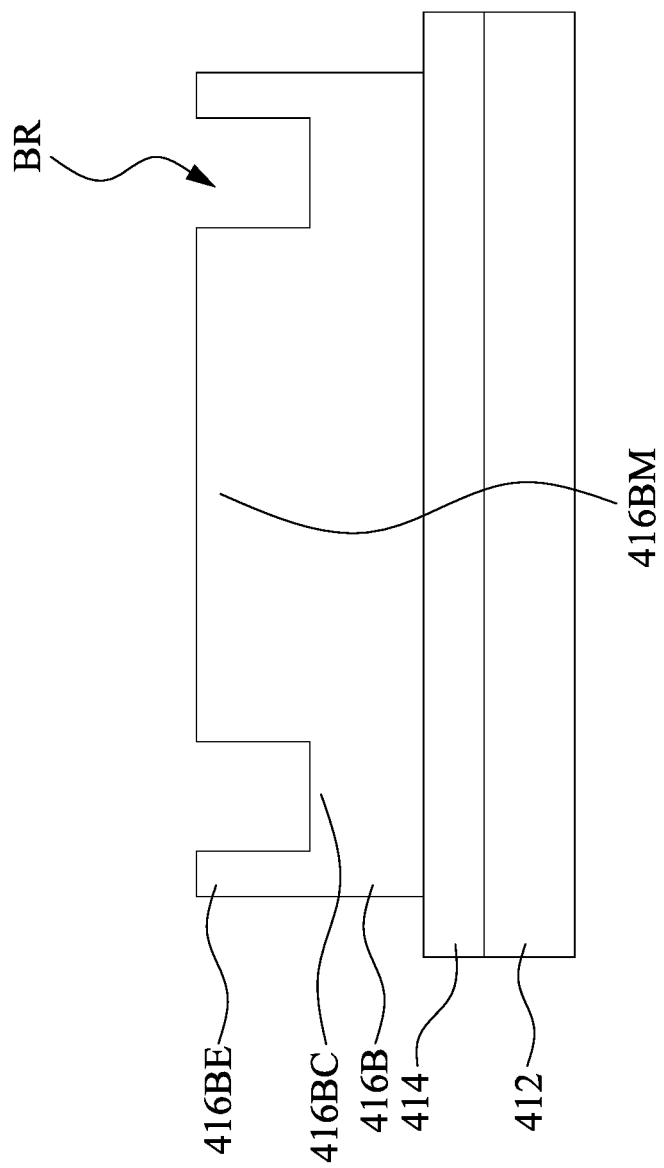
Figure 3E:
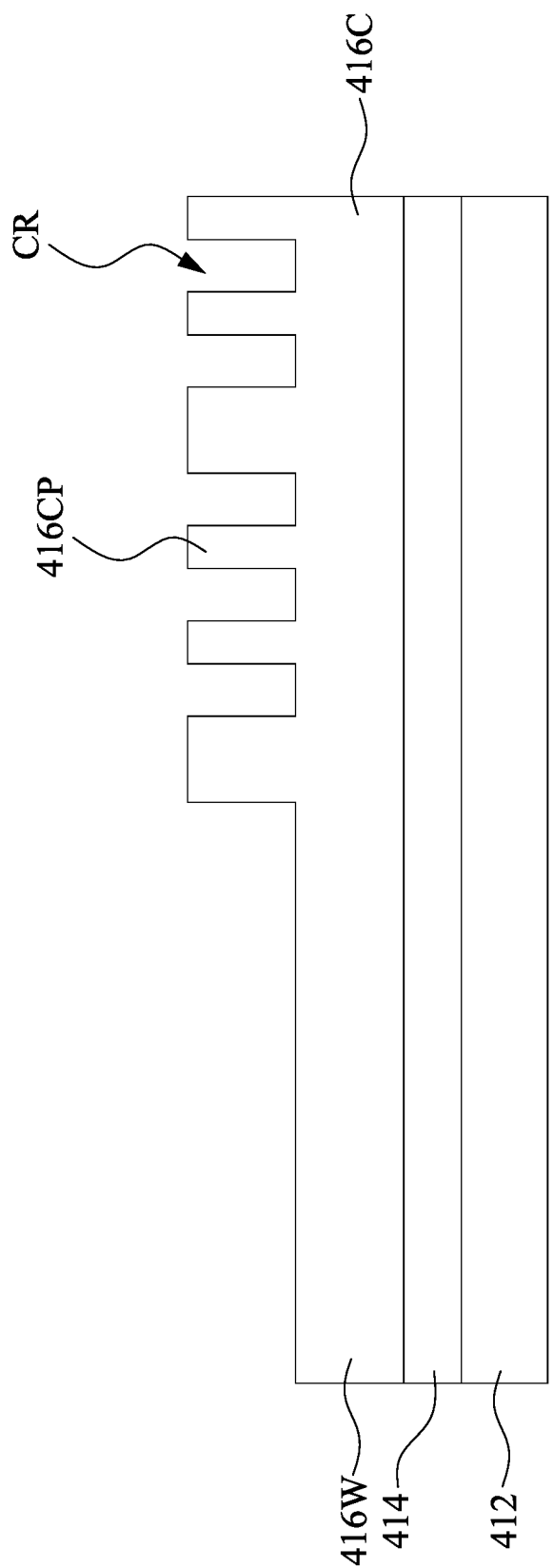

FIGS. 3A-3F illustrating patterning the semiconductor layer 416 (referring to FIG. 2) into suitable structures. The patterning may include plural etching processes, such that the formed structures may have different heights. FIG. 3A is a top view illustrating the formed structure 416A, dummy structures 416B, and waveguide structures 416W. FIG. 3B is a cross-sectional view taken along line B-B in FIG. 3A. FIG. 3C is a cross-sectional view taken along line C-C in FIG. 3A. FIG. 3D is a cross-sectional view taken along line D-D in FIG. 3A. FIG. 3E is a cross-sectional view illustrating the formed coupler structure 416C. FIG. 3F is a cross-sectional view illustrating the formed waveguide structure 416W.

For example, a first mask (e.g., photoresist) is formed over the semiconductor layer 416 (referring to FIG. 2) and exposing first portions of the semiconductor layer 416 (referring to FIG. 2), and then a first etching process is performed to remove the first portions of the semiconductor layer 416 (referring to FIG. 2) through the first mask, thereby forming trenches/recesses AR, BR, and CR in the semiconductor layer 416. The first etch process may use first etchants such as HBr, $SF_6$, $CH_2F_2$, or the like. Then, a second mask (e.g., photoresist) is formed over the semiconductor layer 416 (referring to FIG. 2) and exposing second portions of the semiconductor layer 416 (referring to FIG. 2), and a second etching process is performed to remove the second portions of the semiconductor layer 416 (referring to FIG. 2) through the second mask, thereby patterning the semiconductor layer 416 into the waveguide structure 416W, the structure 416A, the dummy structure 416B, and the coupler structure 416C. The second etch process may use second etchants such as HBr, $SF_6$, $CH_2F_2$, or the like. The second etch process may be performed such that a top surface of the buried insulating layer 414 is exposed. In some embodiments, the buried insulating layer 414 may have a higher etch resistance to the second etchants than that of the semiconductor layer 416 (referring to FIG. 2), thereby protecting the underlying base substrate 412 from being etched.

In some embodiments, the first and second etch processes may be dry etch, wet etch, or the combination thereof. The sequence of the etch processes are exemplarily described herein, and may be changed. For example, in some other embodiments, the first etch process that forms the trenches/recesses AR, BR, and CR may be performed after the second etch process that patterns the semiconductor layer 416 into the waveguide structure 416W, the structure 416A, the dummy structure 416B, and the coupler structure 416C.

Through these etching processes, the waveguide structure 416W, the structure 416A, the dummy structure 416B, and the coupler structure 416C are formed. The structure 416A will forms the photodetector 310 in FIG. 1. The waveguide structure (referring FIG. 3F) 416W may form the waveguides WG in FIG. 1. The coupler structure 416C (referring FIG. 3E) may form the optical couplers CG0-CG2 in FIG. 1. In some embodiments, the waveguide structure 416W connects the coupler structure 416C (referring FIG. 3E) to the structure 416A, such that the coupler structure 416C (referring FIG. 3E) is optically coupled to the structure 416A through the waveguide structure 416W. For example, as shown in FIGS. 3A, 3C, and 3E, the waveguide structure 416W extends from a side of the coupler structure 416C, through additional components (not shown), to a side of the structure 416A. In some embodiments, as shown in FIG. 3A, the waveguide structure 416W and the structure 416A may have suitable silicon tapered portion therebetween for intermediate coupling. In some embodiments, the dummy structure 416B is configured for balancing process loading and improving uniformity. The dummy structure 416B is spaced apart and disconnected from the waveguide structure 416W, the structure 416A, and the coupler structure 416C. In other words, the dummy structure 416B is not optically coupled with the waveguide structure 416W, the structure 416A, and the coupler structure 416C.

To be specific, in some embodiments, referring to FIGS. 3A-3C, the structure 416A may have a middle raising portion 416AM, edge portions 416AE, and connection portions 416AC. The connection portions 416AC have a top surface lower than that of the portions 416AM and 416AE, and the connection portions 416AC connect the middle raising portion 416AM to the edge portions 416AE. In some embodiments, as shown in FIG. 3C, the waveguide structure 416W connects at least the middle raising portion 416AM of the structure 416A to the coupler structure 416C (referring to FIG. 3E), such that the structure 416A may receive the lights form the coupler structure 416C (referring to FIG. 3E).

Similarly, in some embodiments, referring to FIGS. 3A and 3D, the dummy structure 416B may have a middle raising portion 416BM, connection portions 416BC, and edge portions 416BE. The connection portions 416BC have a top surface lower than that of the portions 416BM and 416BE, and the connection portions 416BC connect the middle raising portion 416BM to the edge portions 416BE. Referring to FIGS. 3A-3C, the structure 416A may have different configuration from that of the dummy structure 416B. For example, the middle raising portion 416BM of the dummy structure 416B may be wider than the middle raising portion 416AM of the structure 416A. For clear illustration, edges of the middle raising portions 416AM and 416BM and edges of the waveguide structure 416W are shown in FIG. 3A, while edges of the edge portions 416AE and 416BE are omitted in FIG. 3A.

Referring to FIG. 3E, the coupler structure 416C may be a grating that have plural protruding portions 416CP spaced apart by the trenches CR. The protruding portion 416CP may have suitable widths and pitches, such that the coupler structure 416C is capable of directing the incident light with desired angle to the waveguide structure 416W when receiving lights from a fiber or directing a modulated light from the waveguide structure 416W to a fiber. Referring to FIG. 3F, the waveguide structure 416W has a higher refractive index than a refractive index of the insulator layer 414, and acts as the waveguiding core.

Reference is made to FIGS. 4A-4D. FIGS. 4A-4D are cross-sectional views taken along the same line as that of FIGS. 3B-3E. Plural ion implantation processes are performed to the structure 416A, thereby forming a first doped region 416AN and a second doped region 416AP in the structure 416A, in which the first doped region 416AN has a first conductive type (e.g., n-type) opposite to a second conductive type (e.g., p-type) of the second doped region 416AP.

For example, the first doped region 416AN having the first conductive type (e.g., n-type) is formed in the structure 416 by forming a first doping mask (not shown), such as an oxide, silicon nitride, and/or photoresist layer for example, over an upper surface of the structure 416A. The first doping mask leaves a portion of the upper surface of the structure 416A, which corresponds to the first doped region 416AN, exposed; and covers other portions of the upper surface of the structure 416A and the structures 416B, 416C, 416W. For example, the first doping mask leaves a first part of the middle raising portion 416AM, a first one of the connection portions 416AC, and a first one of the edge portions 416AE exposed and covers a second part of the middle raising portion 416AM, a second one of the connection portions 416AC, a second one of the edge portions 416AE, and the structures 416B, 416C, 416W. With the first doping mask in place, ions (e.g., n-type dopants) are implanted into the structure 416A to form the first doped region 416AN. For example, the n-type dopants may include phosphorous, arsenic, antimony, or the like. For creating tunneling junctions at the Si/Ge interface, the doping concentration of the n-type dopants may be on the order of $10^{19}$ cm$^{-3}$ or more. In some other embodiments, a highly doped layer is formed over the structure 416A and then dopants are out-diffused from the highly doped layer into the structure 416A to form the first doped region 416AN. The first doping mask may then be removed by suitable process after the n-type implantation.

The second doped region 416AP having the second conductive type (e.g., p-type) is formed in the structure 416A by forming a second doping mask (not shown), such as an oxide, silicon nitride, and/or photoresist layer for example, over the upper surface of the structure 416A. The second doping mask leaves a portion of the upper surface of the structure 416A, which corresponds to the second doped region 416AP, exposed; and covers other portions of the upper surface of the structure 416A and the structures 416B, 416C, 416W. For example, the second doping mask leaves the second part of the middle raising portion 416AM, the second one of the connection portions 416AC, and the second one of the edge portions 416AE exposed and covers the first part of the middle raising portion 416AM, the first one of the connection portions 416AC, the first one of the edge portions 416AE, and the structures 416B, 416C, 416W. With the second doping mask in place, ions (e.g., p-type dopants) are implanted into the substrate to form the second doped region 416AP. For example, the p-type dopants may include boron, gallium, indium, or the like. For creating tunneling junctions at the Si/Ge interface, the doping concentration of the p-type dopants may be on the order of $10^{19}$ cm$^{-3}$ or more. In some other embodiments, a highly doped layer is formed over the substrate and then dopants are out-diffused from the highly doped layer into the substrate to form the second doped region 416AP. The second doping mask may then be removed by suitable process after the p-type implantation.

Figure 4A:
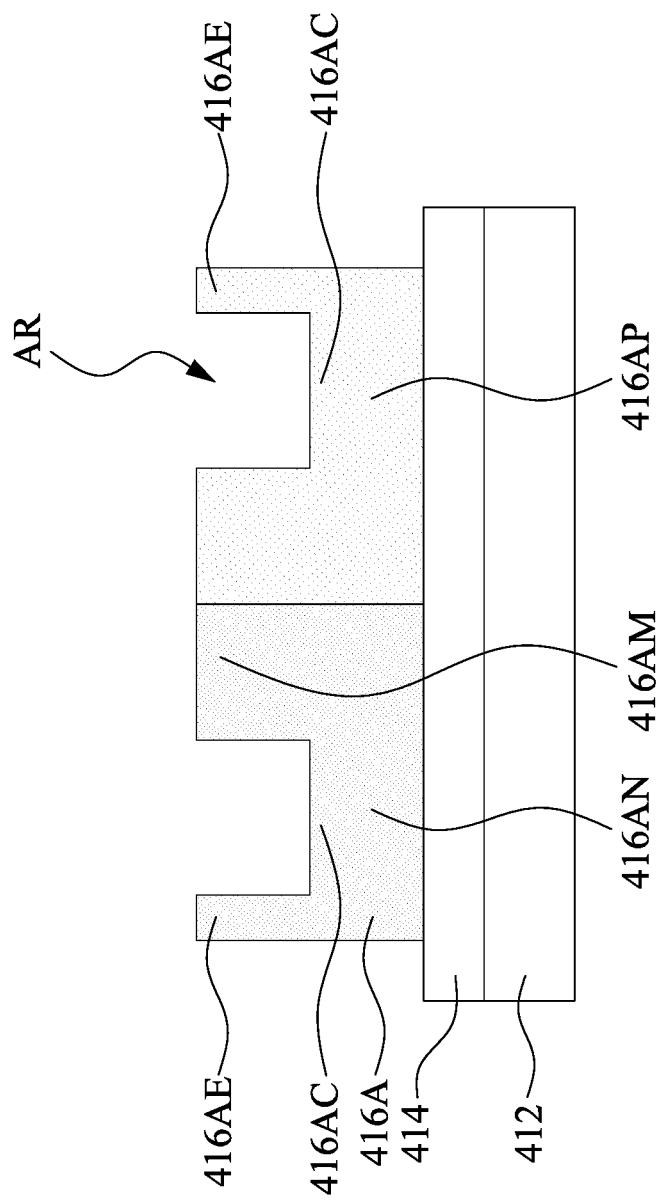
Figure 4B:
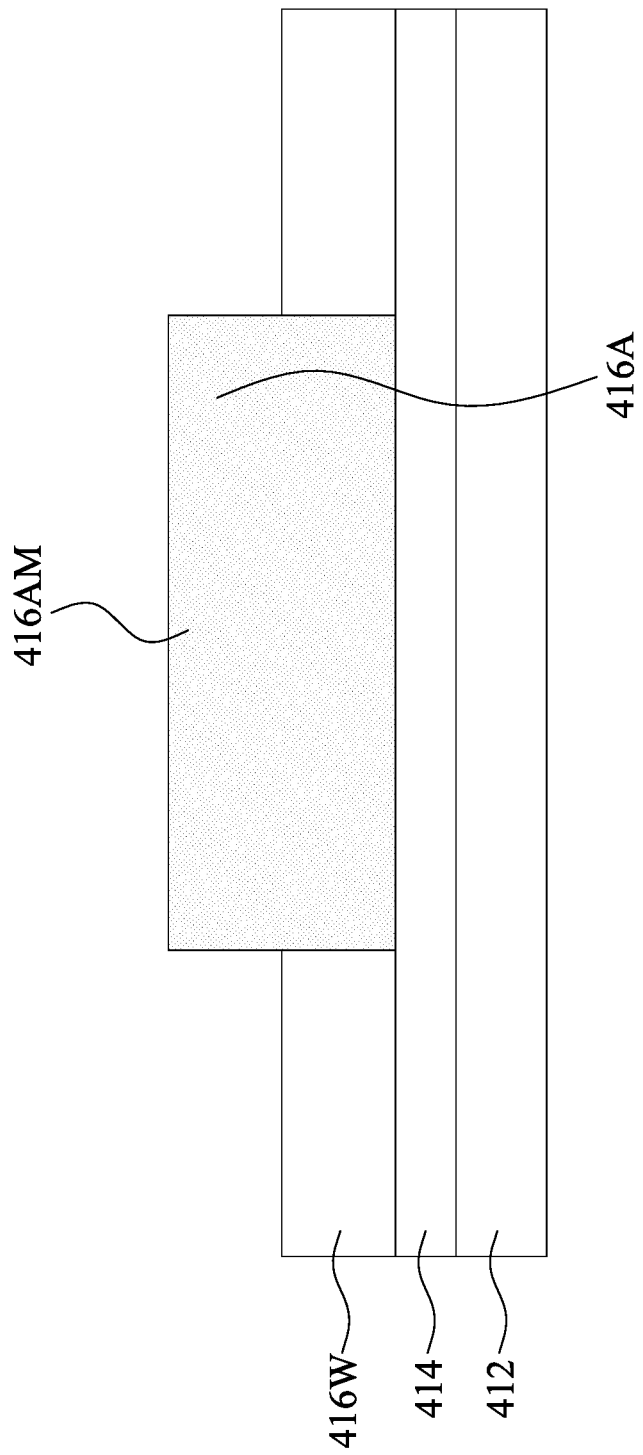
Figure 4C:
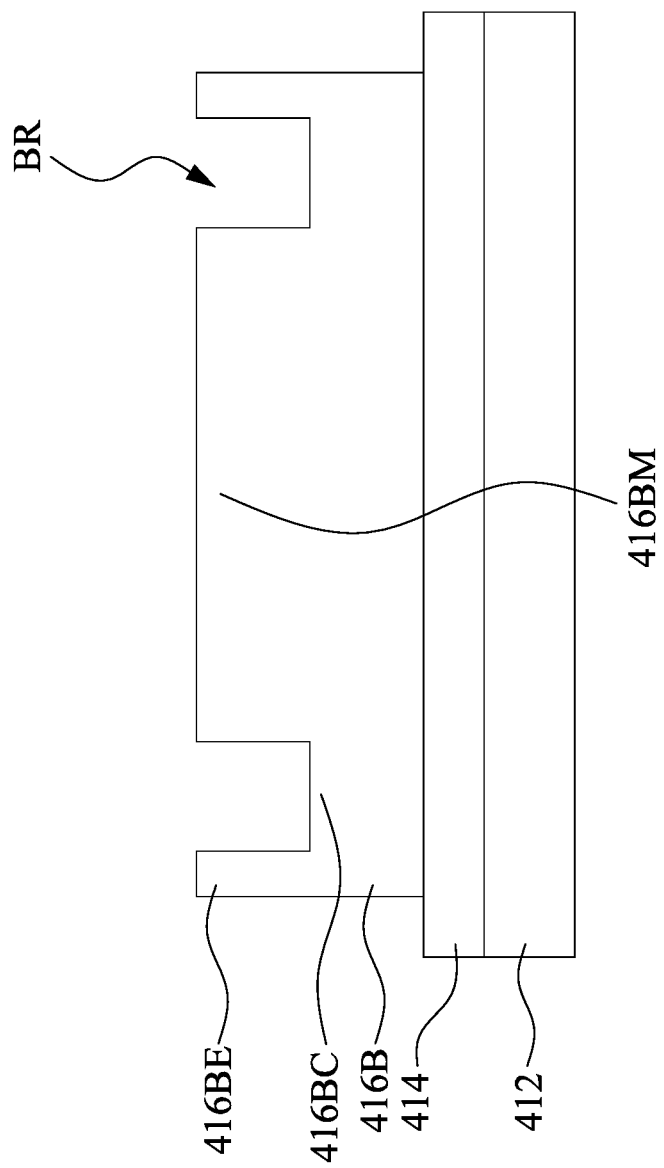
Figure 4D:
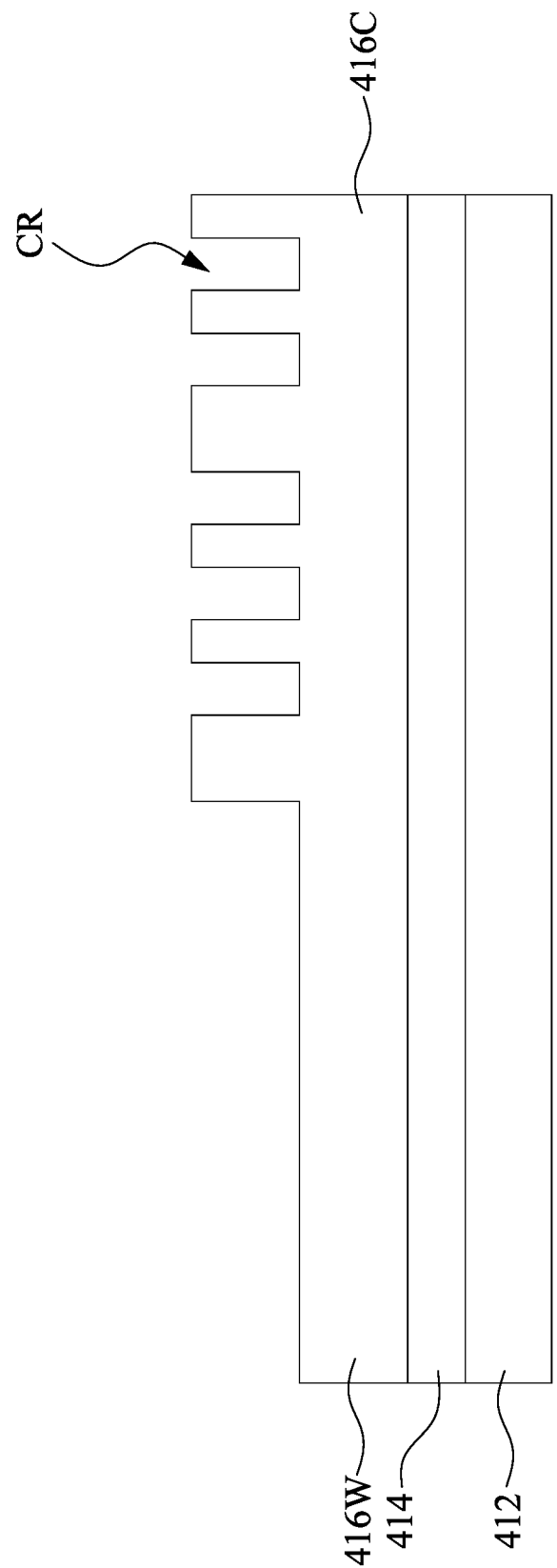
Figure 5A:
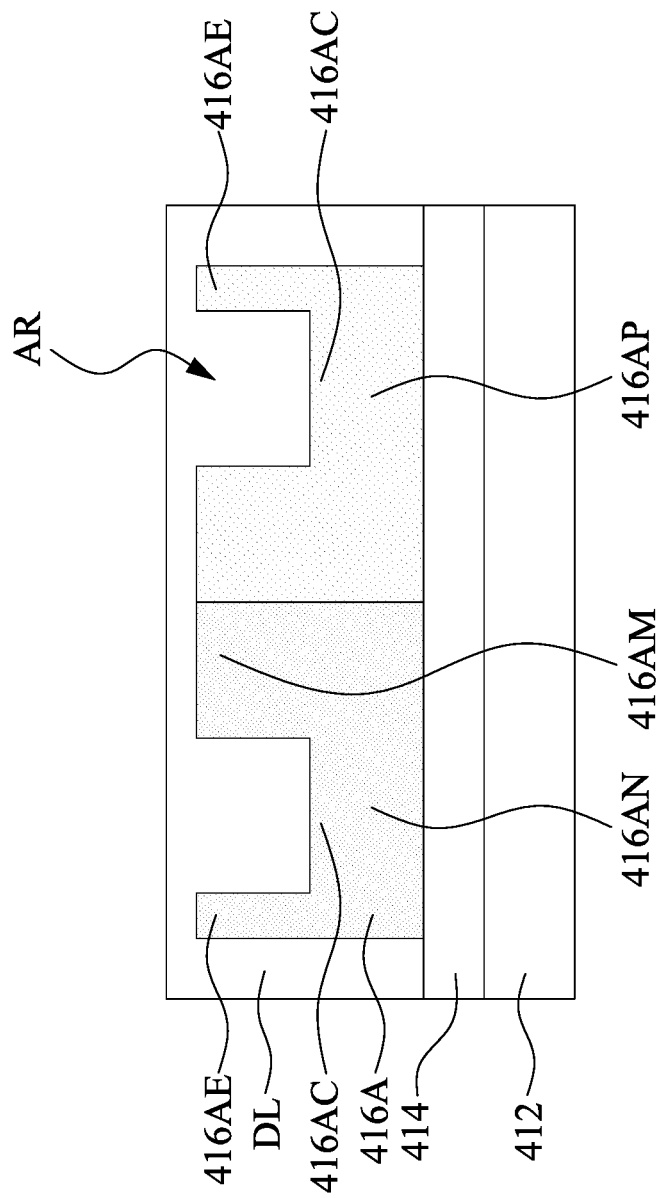
Figure 5B:
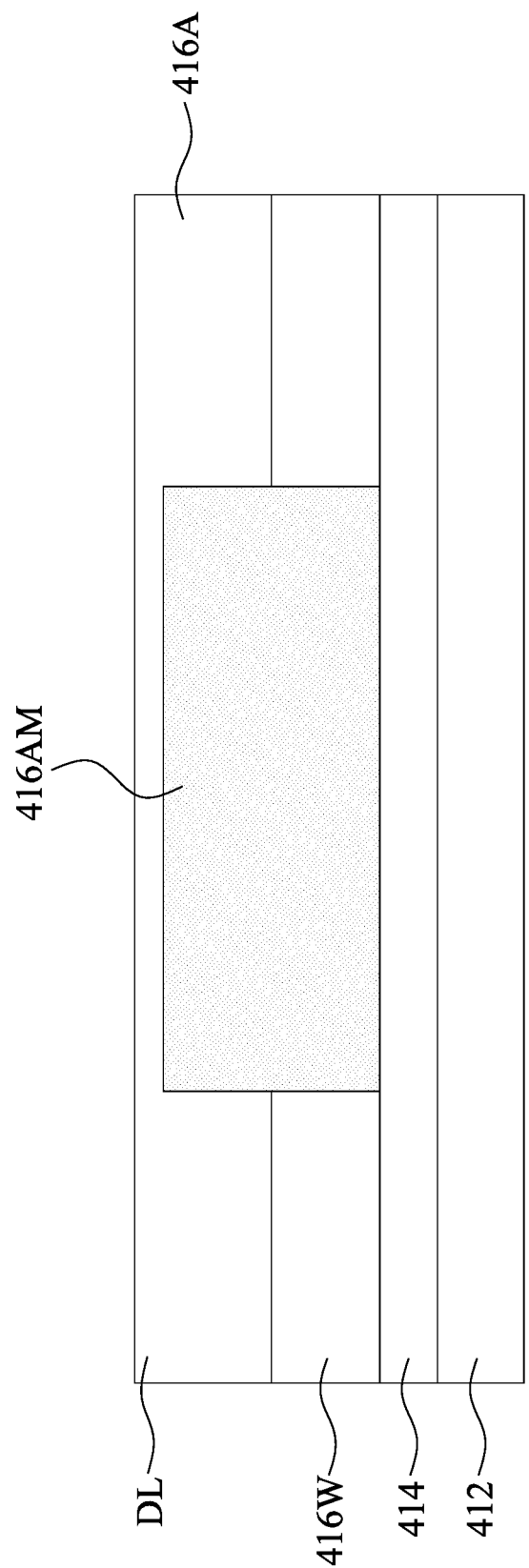
Figure 5D:
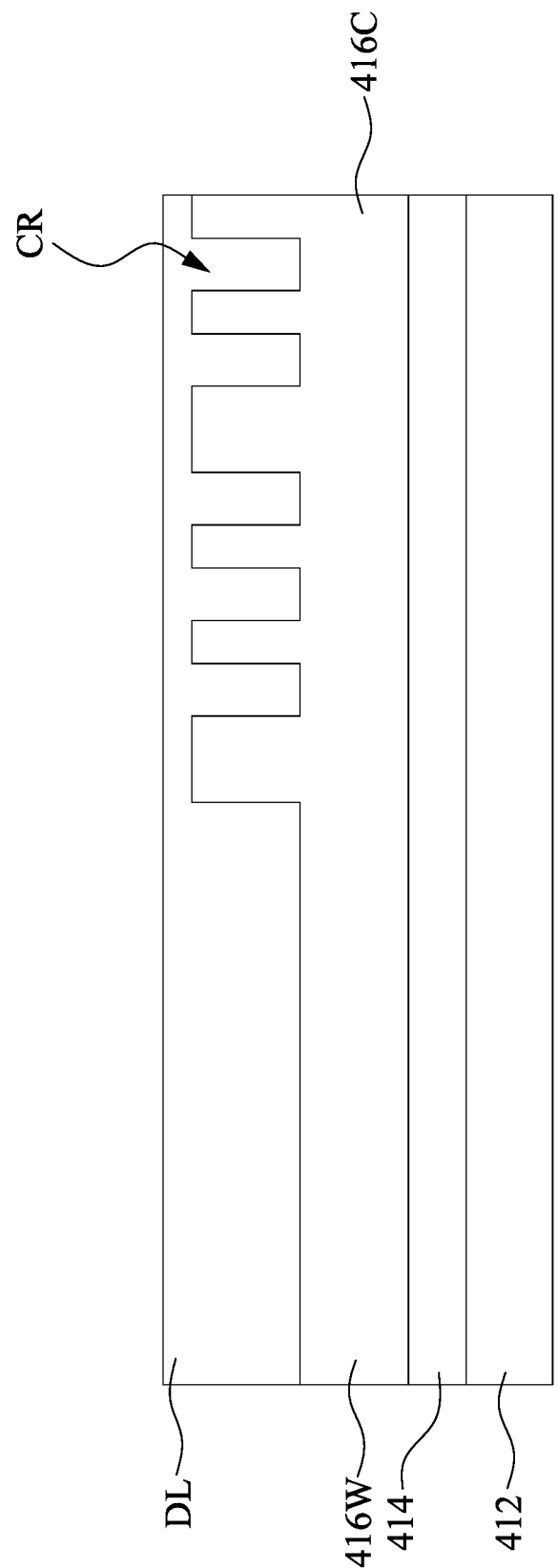

The second doped region 416AP may be formed prior to the first doped region 416AN, or vice versa, depending on the implementation. The middle raising portion 416AM shown in FIG. 4B is exemplarily depicted as having a dense dotted pattern regarding the first doped region 416AN in the present embodiments, but may be depicted as having a sparse dotted pattern regarding the second doped region 416AP in some alternative embodiments. In some embodiments, through the coverage of the first and second doping masks (not shown), the structures 416B, 416W, and 416C remains undoped after the implantation process.

Reference is made to FIGS. 5A-5D. FIGS. 5A-5D are cross-sectional views taken along the same line as that of FIGS. 4A-4D. A dielectric layer DL is formed over the structure of FIGS. 4A-4D. In some embodiments, the dielectric layer DL may include an oxide (e.g., $SiO_2$), an ultra-low k dielectric material, a low-k dielectric material (e.g., SiCO), SiON, or the like. In some embodiments, the dielectric layer DL may be formed by a physical vapor deposition (PVD) process, chemical vapor deposition (CVD) process, flowable CVD process, atomic layer deposition (ALD), or other suitable process, or the combination thereof. The dielectric layer DL may surround and cover the waveguide structure 416W, the structure 416A, the dummy structure 416B, and the coupler structure 416C.

In some embodiments, a refractive index of the material of the waveguide structure 416W is higher than a refractive index of the material of the dielectric layer DL. Due to the difference in refractive indices of the materials of the waveguide structure 416W and dielectric layer DL, the waveguide structure 416W have high internal reflections such that light is confined in the waveguide structure 416W, depending on the wavelength of the light and the reflective indices of the respective materials. Through the configuration, the waveguide structure 416W may have a strong optical confinement because it is surrounded by the insulator layer 414 and a low-index material (e.g., the air or other cladding materials of the dielectric layer DL).

Figure 6A:
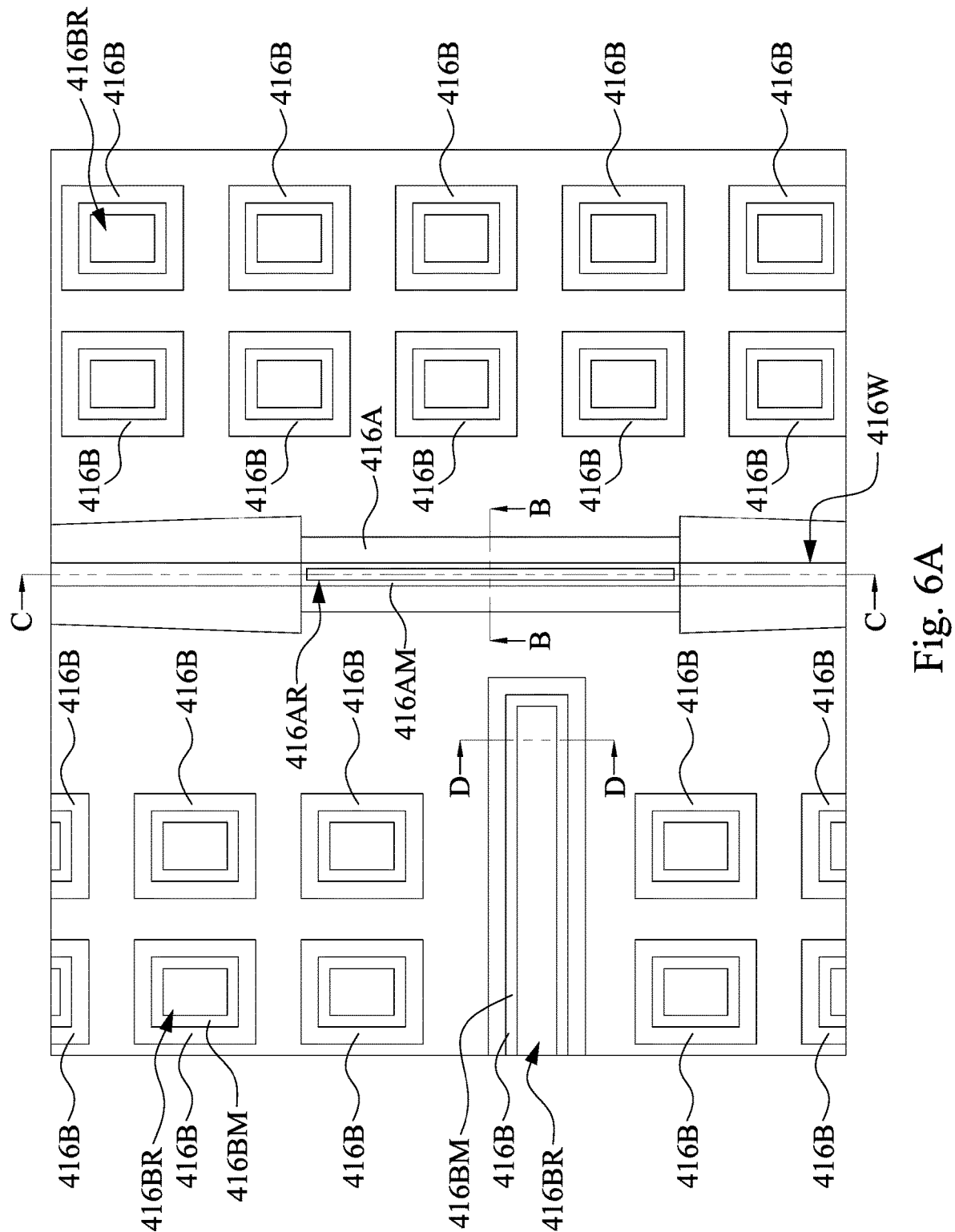
Figure 6B:
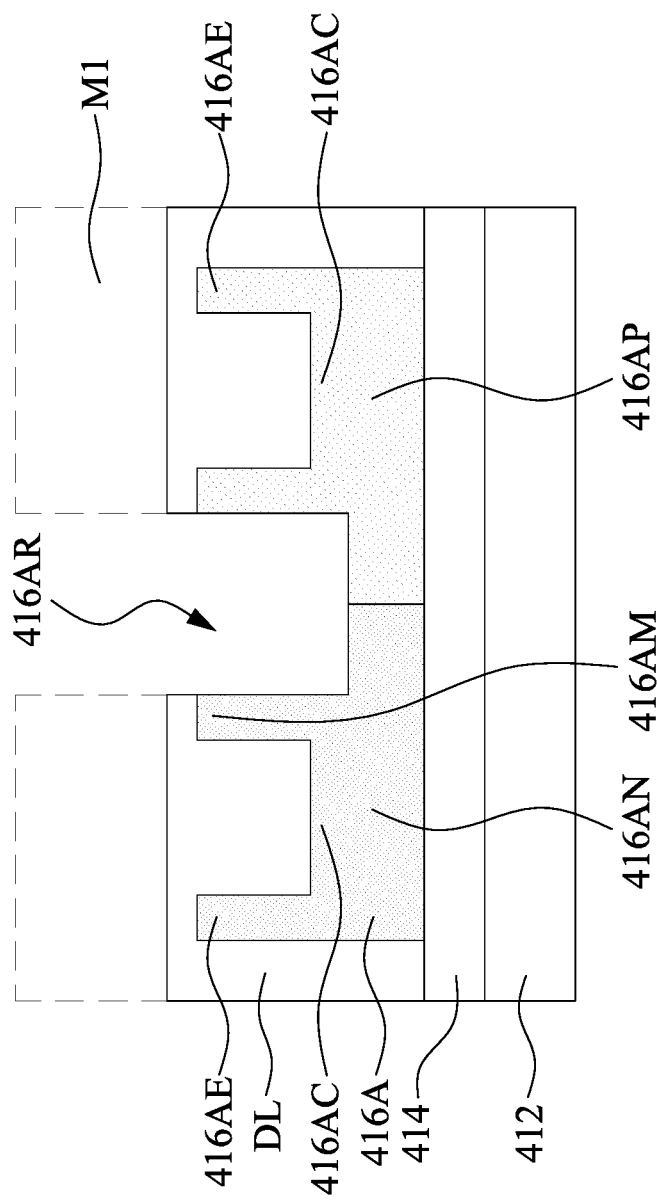
Figure 6C:
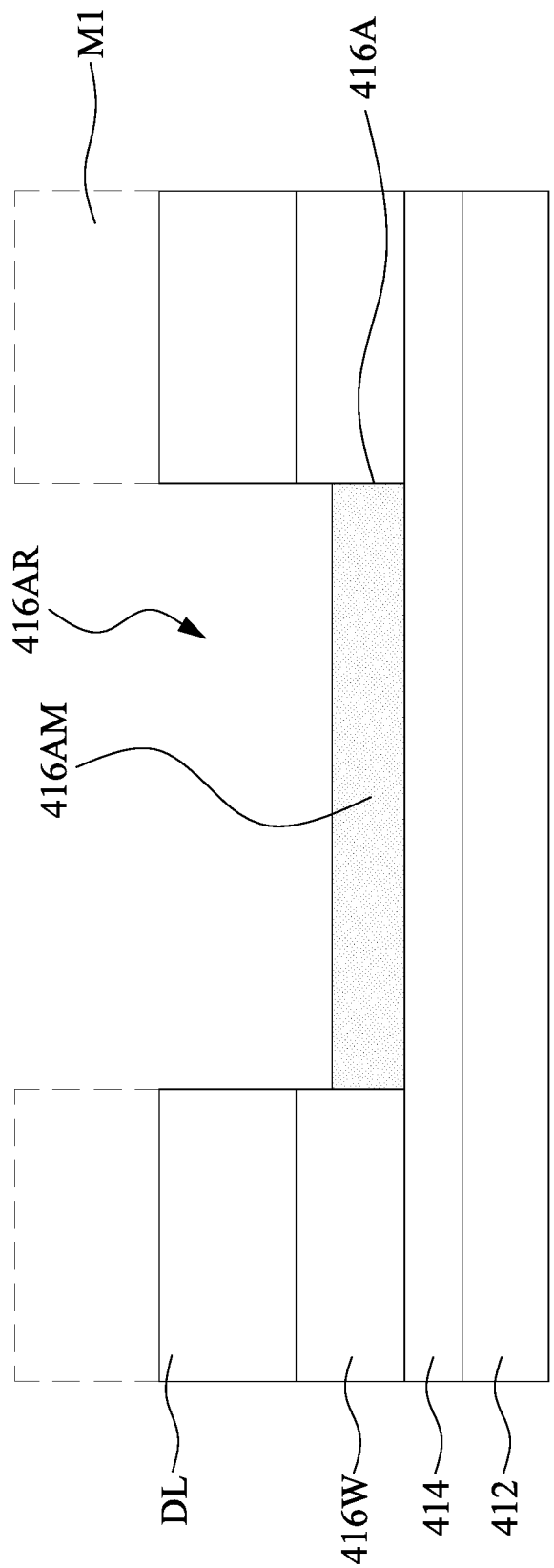
Figure 6D:
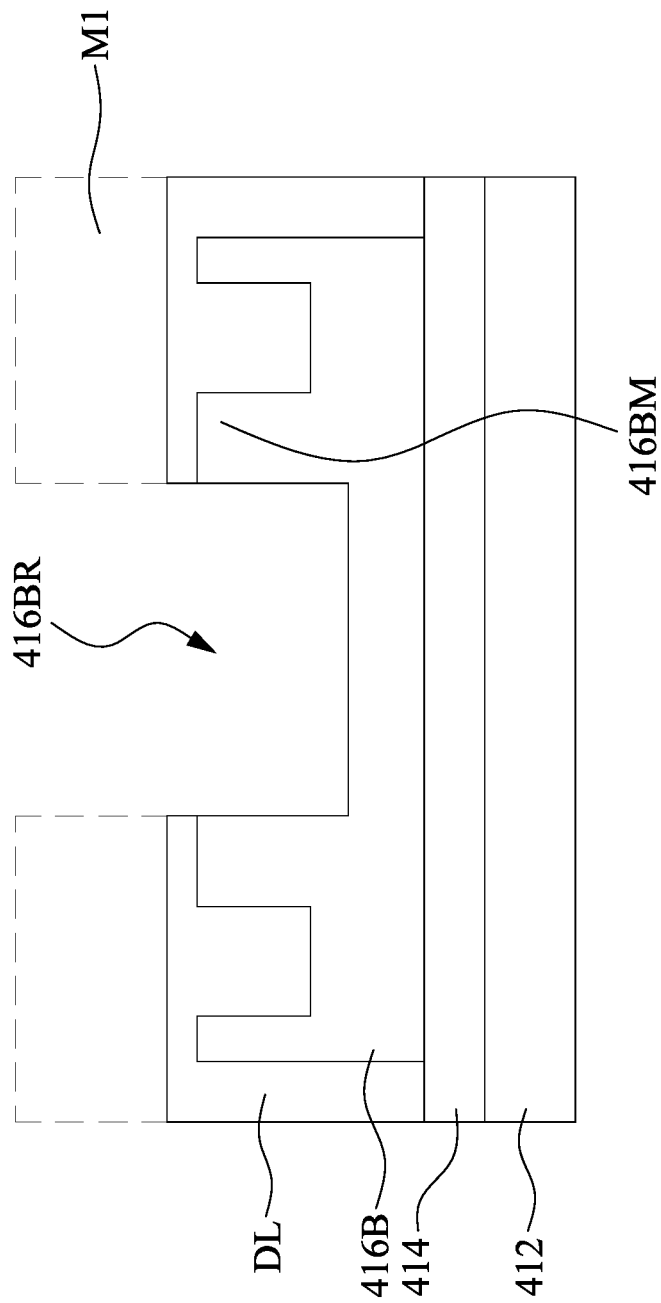

Reference is made to FIGS. 6A-6D. FIG. 6A is a top view of a photonic device 100 at an intermediate stage of manufacture according to some embodiments of the present disclosure. FIG. 6B is a cross-sectional view taken along line B-B in FIG. 6A. FIG. 6C is a cross-sectional view taken along line C-C in FIG. 6A. FIG. 6D is a cross-sectional view taken along line D-D in FIG. 6A. Recesses 416AR and 416BR (or trenches) are respectively formed in the middle raising portions 416AM and 416BM of the structures 416A and 416B. For clear illustration, edges of the recesses 416AR and 416BR are shown in FIG. 3A.

For example, a patterned mask layer M1 is formed over the structure of FIGS. 5A-5D and exposing parts of the dielectric layer DL over the middle raising portions 416AM and 416BM (referring to FIGS. 5A-5D). The patterned mask layer M1 may include suitable photoresist material that can be patterned through suitable lithography process. For example, the patterned mask layer M1 may include suitable organic material or the like. Subsequently, a first etching process is performed to remove the exposed parts of the dielectric layer DL through the patterned mask layer M1, thereby exposing the underlying middle raising portions 416AM and 416BM (referring to FIGS. 5A-5D). Then, a second etching process is performed to the underlying middle raising portions 416AM and 416BM through the openings in the dielectric layer DL, thereby forming the recesses 416AR and 416BR in the middle raising portions 416AM and 416BM. The first and second etching processes may be dry etch (e.g., plasma etch), wet etch, or the combination thereof.

In some embodiments, the configuration of the recess 416BR may be different from that of the recess 416AR. For example, a width of the recess 416BR is greater than that of the recess 416AR. After the formation of the recesses 416AR and 416BR, the dielectric layer covers top surfaces of the structures 416A, 416B, 416C, and 416W, and exposing some surfaces of the structure 416A (i.e., the sidewalls and bottom surfaces of the recesses 416AR and 416BR). In some embodiments, after the formation of the recesses 416AR and 416BR, the mask layer M1 is removed by suitable ashing process.

Figure 7A:
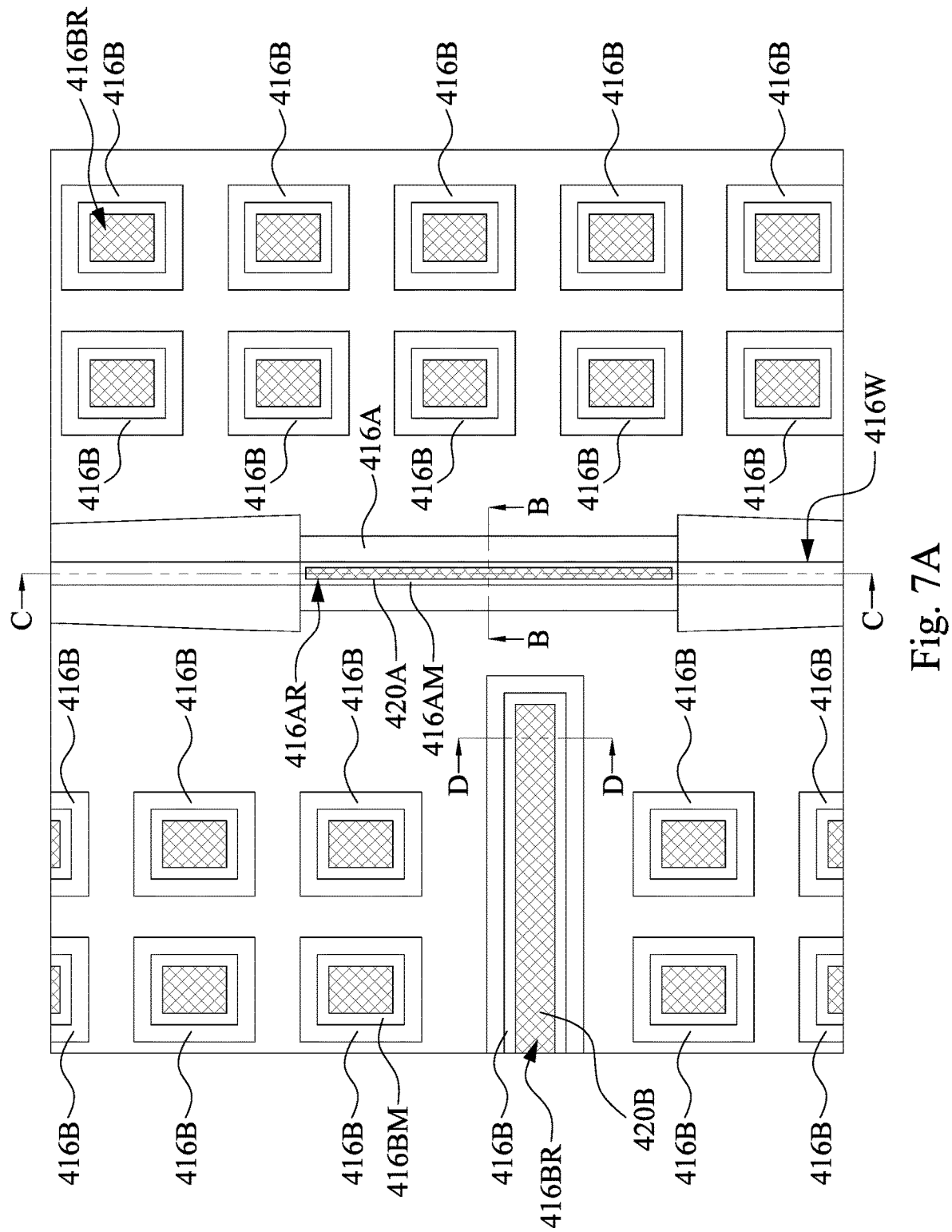
Figure 7B:
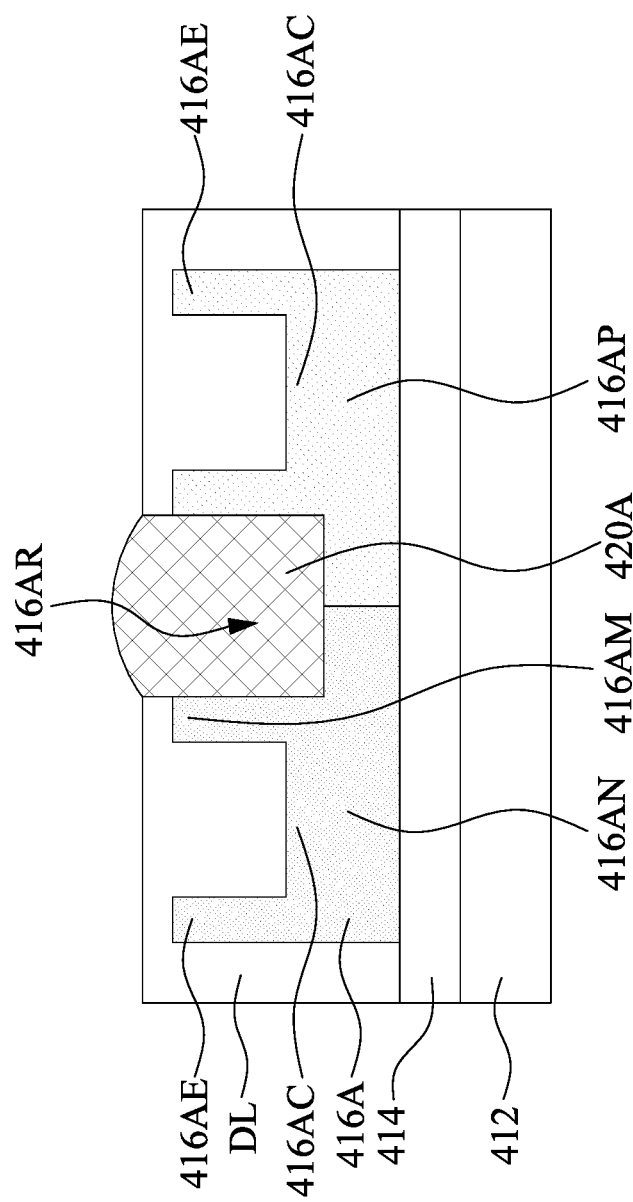
Figure 7C:
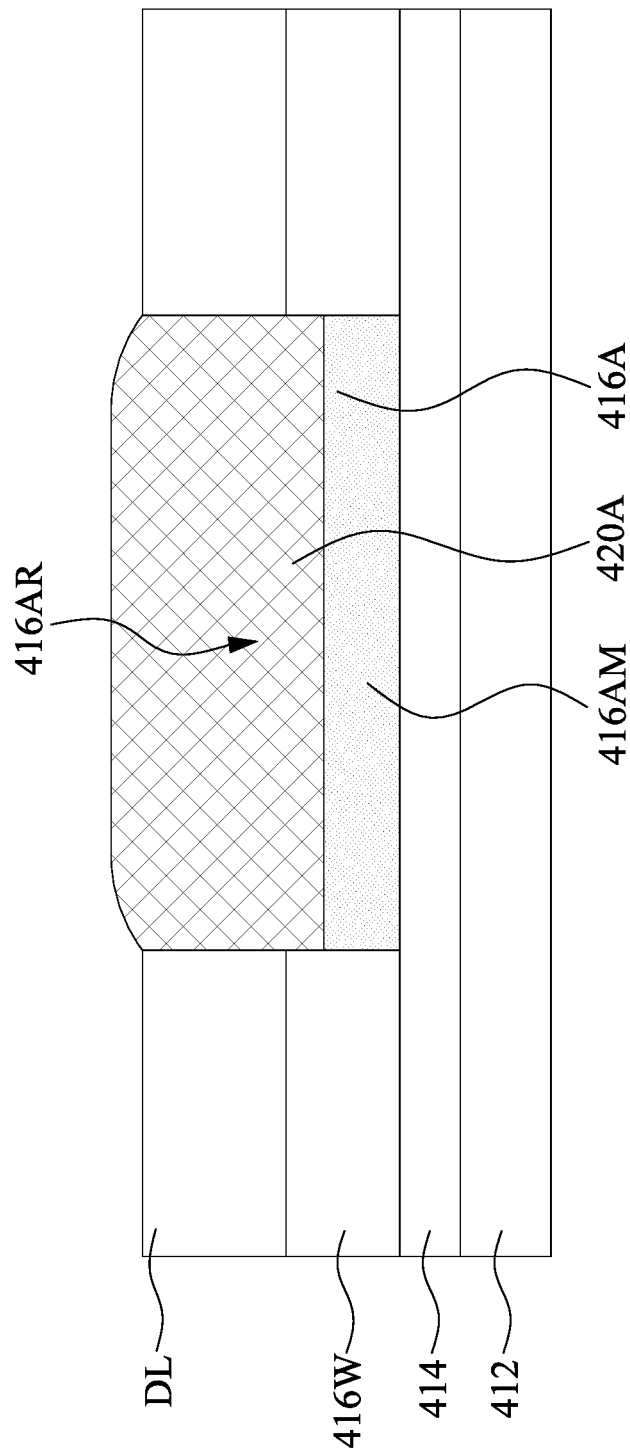
Figure 7D:
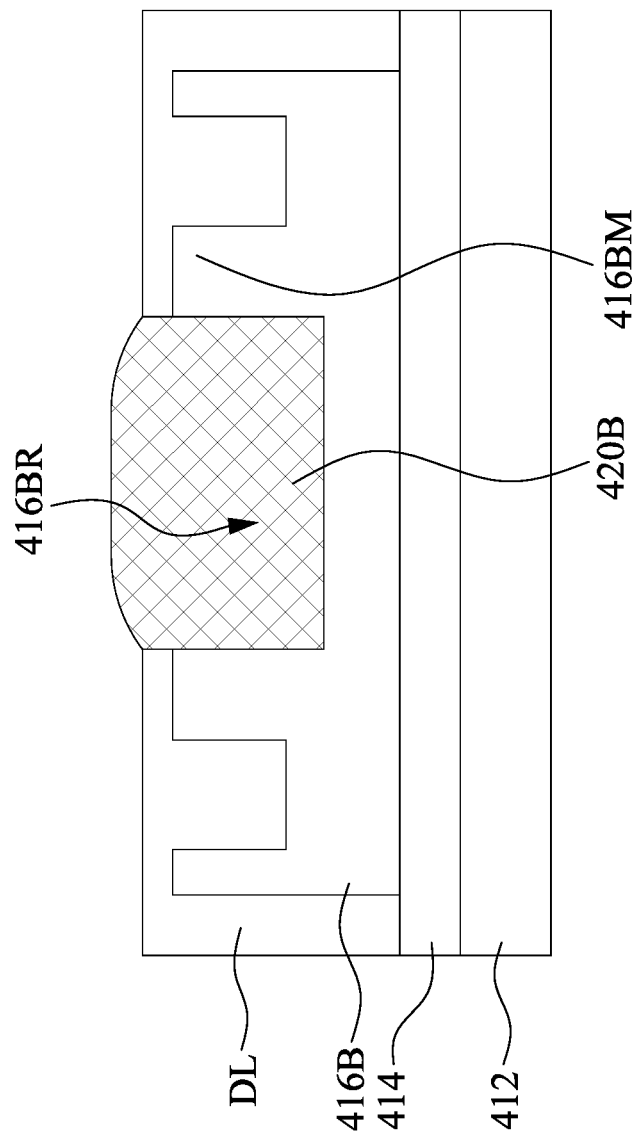
Figure 8A:
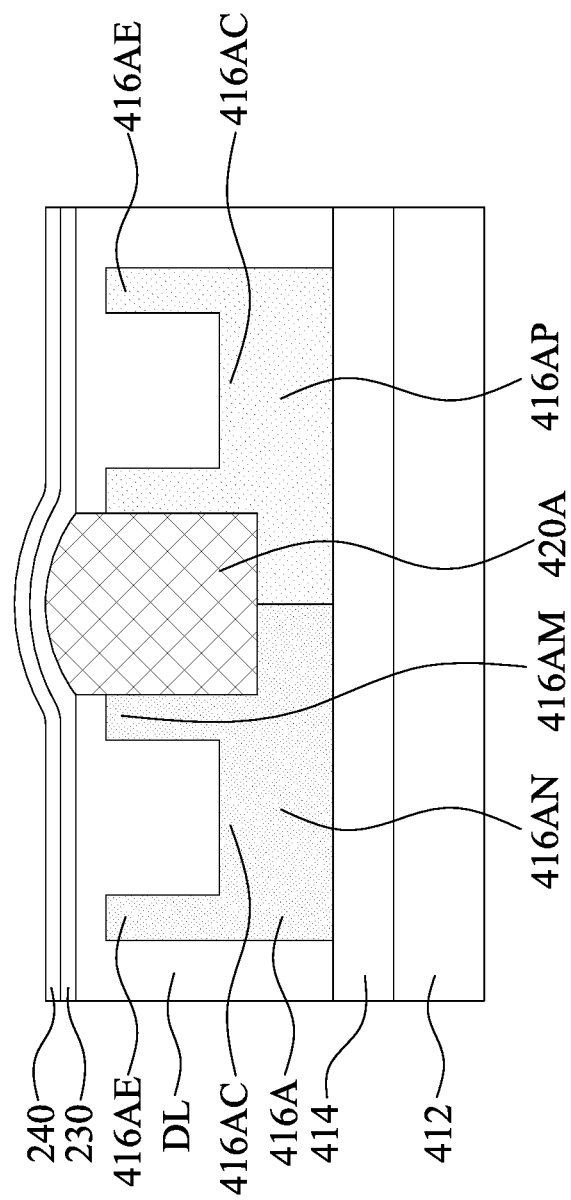
Figure 8B:
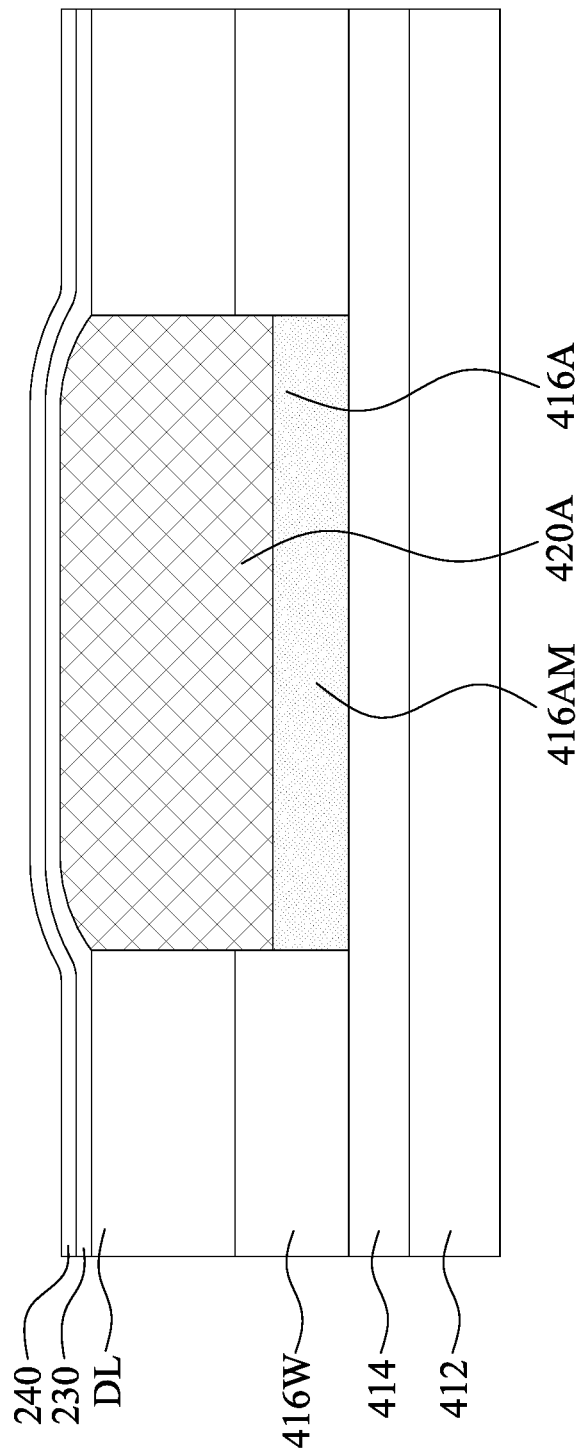
Figure 8C:
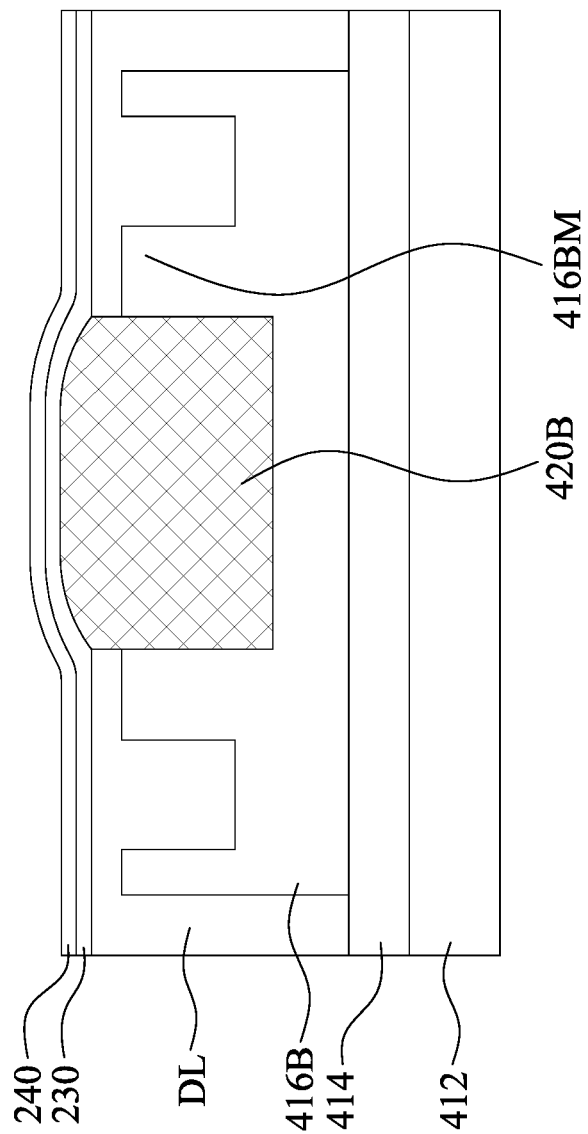
Figure 8D:
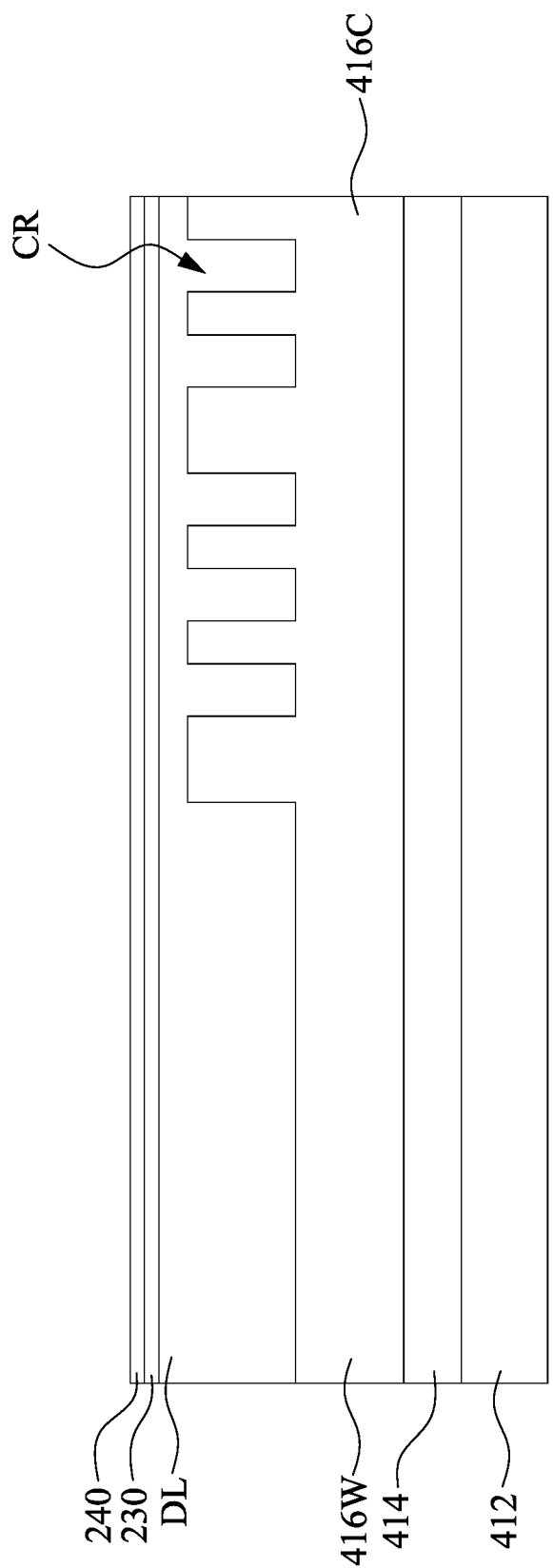

Reference is made to FIGS. 7A-7D. FIG. 7A is a top view of a photonic device 100 at an intermediate stage of manufacture according to some embodiments of the present disclosure. FIG. 7B is a cross-sectional view taken along line B-B in FIG. 7A. FIG. 7C is a cross-sectional view taken along line C-C in FIG. 7A. FIG. 7D is a cross-sectional view taken along line D-D in FIG. 7A. Semiconductor features 420A and 420B are formed in the recesses 416AR and 416BR, respectively. For example, a deposition process is performed to the structure of FIGS. 6A-6D, such that the semiconductor features 420A and 420B are epitaxially grown from the exposed surfaces of the structures 416A and 416B (i.e., the sidewalls and bottom surfaces of the recesses 416AR and 416BR). The epitaxially grown semiconductor feature 420A may be partially in the recess 416AR, and partially out of the recess 416AR, and the epitaxially grown semiconductor feature 420B may be partially in the recess 416BR, and partially out of the recess 416BR. For example, the epitaxially grown semiconductor features 420A and 420B may have a protruding top surface protruding from the dielectric layer DL. The deposition process may be chemical vapor deposition (CVD) techniques (e.g., vapor-phase epitaxy (VPE) and/or ultra-high vacuum CVD (UHV-CVD)), molecular beam epitaxy, and/or other suitable processes. In the present embodiments, parameters of the deposition process (e.g., deposition temperature) may be controlled to realize a selective epitaxial growth, such that the semiconductor material (e.g., germanium) is deposited at a higher growth rate over the exposed surfaces of the structures 416A and 416B than a growth rate over a top surface of the dielectric layer DL. Through the configuration, the formation of the semiconductor features 420A and 420B may leave little or no semiconductor materials over the dielectric layer DL.

In some other embodiments, addition dielectric spacers may be formed to cover the sidewalls of the recesses 416AR and 416BR prior to the formation of the semiconductor features 420A and 420B, and therefore the semiconductor features 420A and 420B are epitaxially grown from the exposed bottom surfaces of the recesses 416AR and 416BR, not from the sidewalls of the recesses 416AR and 416BR.

In the present embodiments, the semiconductor features 420A and 420B may include suitable pure semiconductor materials, such as germanium (Ge), the combination thereof, or the like in some embodiments. For example, germanium has a cut-off wavelength near ~1.8 micrometers, and therefore may be an ideal candidate for photo-detection in the field of optical communication. In some alternative embodiments, the semiconductor features 420A and 420B may include suitable semiconductor alloy materials, such as silicon germanium (SiGe). In some other embodiments, rather than a Ge or SiGe epitaxial material being grown for the semiconductor features 420A and 420B, other materials, such as monocrystalline silicon, a binary semiconductor material (e.g., GaAs, InAs, InP, GaSb), tertiary semiconductor material (e.g., InGaAs), or other semiconductor material can be grown to form the semiconductor features 420A and 420B.

In some embodiments, the semiconductor features 420A and 420B are intrinsic and not intentionally doped, for example, not having intentionally placed dopants, but rather having a doping resulting from process contaminants. For example, the semiconductor features 420A and 420B are not intentional doped (NID) semiconductor layers and thus free from the dopants in the doped regions 416AN and 416AP. Alternatively, the semiconductor features 420A and 420B may be doped with a p-type or an n-type, and with a doping concentration lower than that of the doped regions 416AN and 416AP. For example, the semiconductor features 420A and 420B have dopant concentration lower than about $10^{13}/cm^3$.

The semiconductor features 420A and 420B may have a material different from that of the underlying semiconductor structures 416A and 416B. For example, the semiconductor features 420A and 420B may include germanium (Ge), silicon germanium (SiGe), or other suitable semiconductor material. Due to the refractive index difference between the semiconductor feature 420A (e.g., Ge or SiGe) and the structures 416A and 416W (e.g., Si), incoming light coupled from the waveguide structure 416W (e.g., Si) into the semiconductor feature 420A stays confined in the semiconductor feature 420A, and does not spread out in the doped regions, avoiding any deleterious absorption of photo-generated carriers. In some other embodiments, the semiconductor features 420A and 420B may have a material the same as that of the underlying semiconductor structures 416A and 416B. For example, the semiconductor features 420A and 420B may include silicon as the underlying semiconductor structures 416A and 416B does.

Reference is made to FIGS. 8A-8D. FIGS. 8A-8D are cross-sectional views taken along the same line as that of FIGS. 7B-7D. A first capping film 230 is deposited over the structure of FIG. 7A-7D, and then a second capping film 240 is deposited over the first capping film 230. The first capping film 230 may include suitable dielectric materials, such as silicon nitride, silicon oxynitride, silicon nitrogen hydride (SiNH), the combination thereof, or the like. The second capping film 240 may include suitable dielectric materials different from that of the first capping film 230. For example, the second capping film 240 may include silicon oxide, silicon oxynitride, or the like. In some embodiments, materials of the first and second capping films 230 and 240 are chosen such that an oxide concentration in the second capping film 240 may be greater than an oxide concentration in the first capping film 230. That is, an atomic percentage content of oxygen in the second capping film 240 is greater an atomic percentage content of oxygen in the first capping film 230. For example, the first capping film 230 include $Si_{x1}O_{y1}N_{1-x1-y1}$, the second capping film 240 include $Si_{x2}O_{y2}N_{1-x2-y2}$, and y2 is greater than y1. In some embodiments, materials of the first and second capping films 230 and 240 are chosen such that a refractive index of the first capping film 230 is greater than a refractive index of the second capping film 240. The first capping film 230 and the second capping film 240 may be formed by suitable deposition process, such as CVD process, physical vapor deposition (PVD) process, or the like.

Furthermore, in some embodiments where the first capping film 230 includes silicon nitride, the second capping film 240 may include silicon oxide or silicon oxynitride. In some embodiments where the first capping film 230 includes SiNH, the second capping film 240 may include silicon oxide or silicon oxynitride. In some embodiments where the first capping film 230 includes silicon oxynitride, the second capping film 240 may include silicon oxide. In the present embodiments, the first capping film 230 may be in contact with the dielectric layer DL. The dielectric layer DL may space the first and second capping films 230 and 240 from the structures 416A, 416B, 416C, and 416W.

Figure 9A:
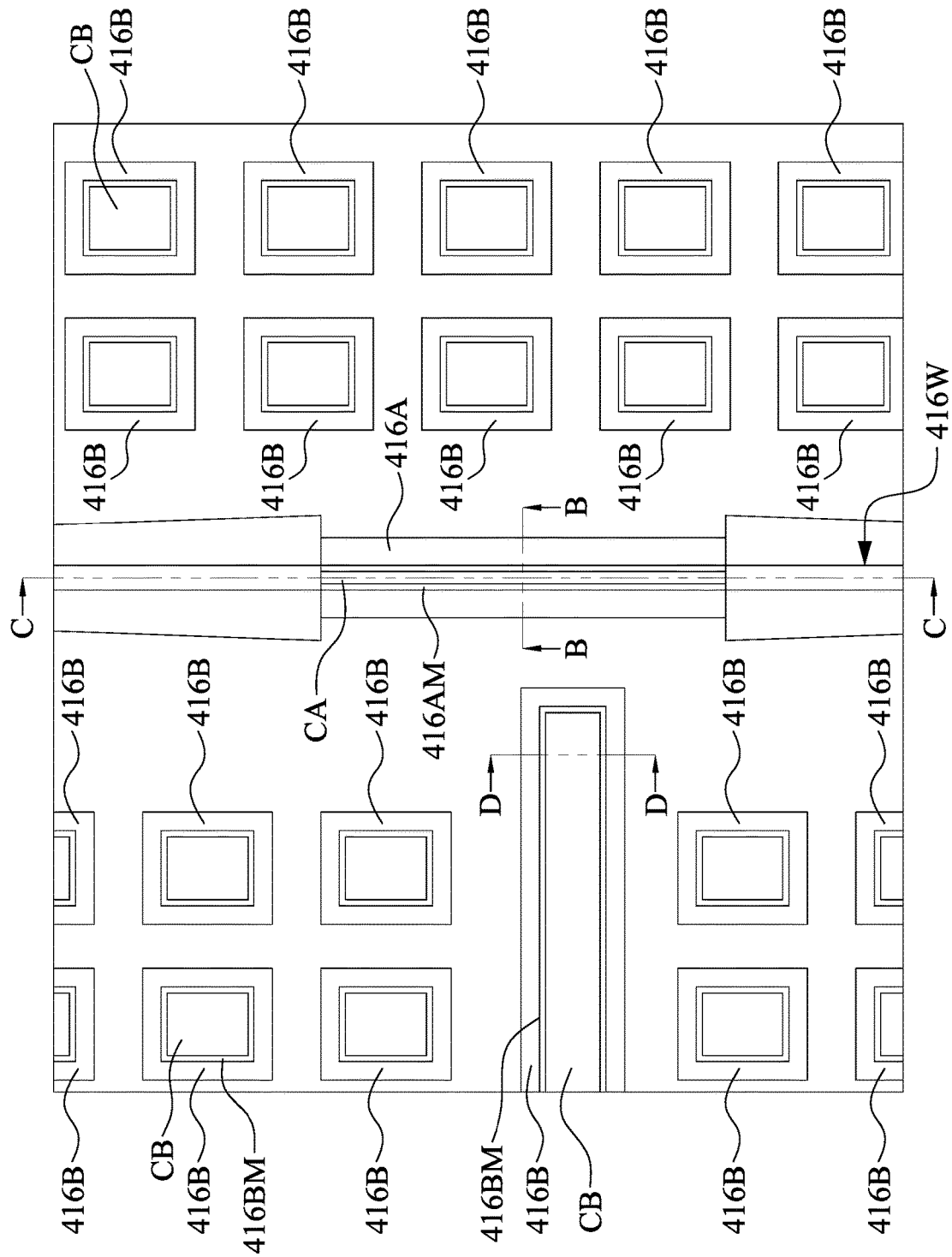
Figure 9B:
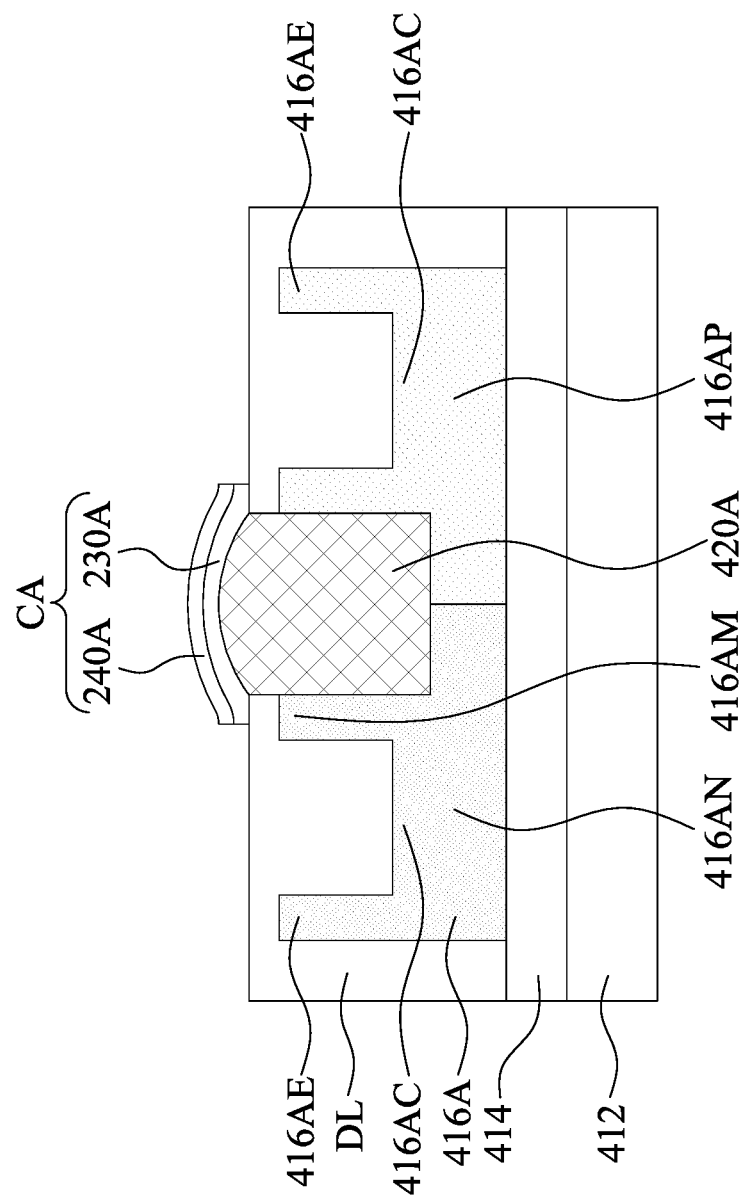
Figure 9C:
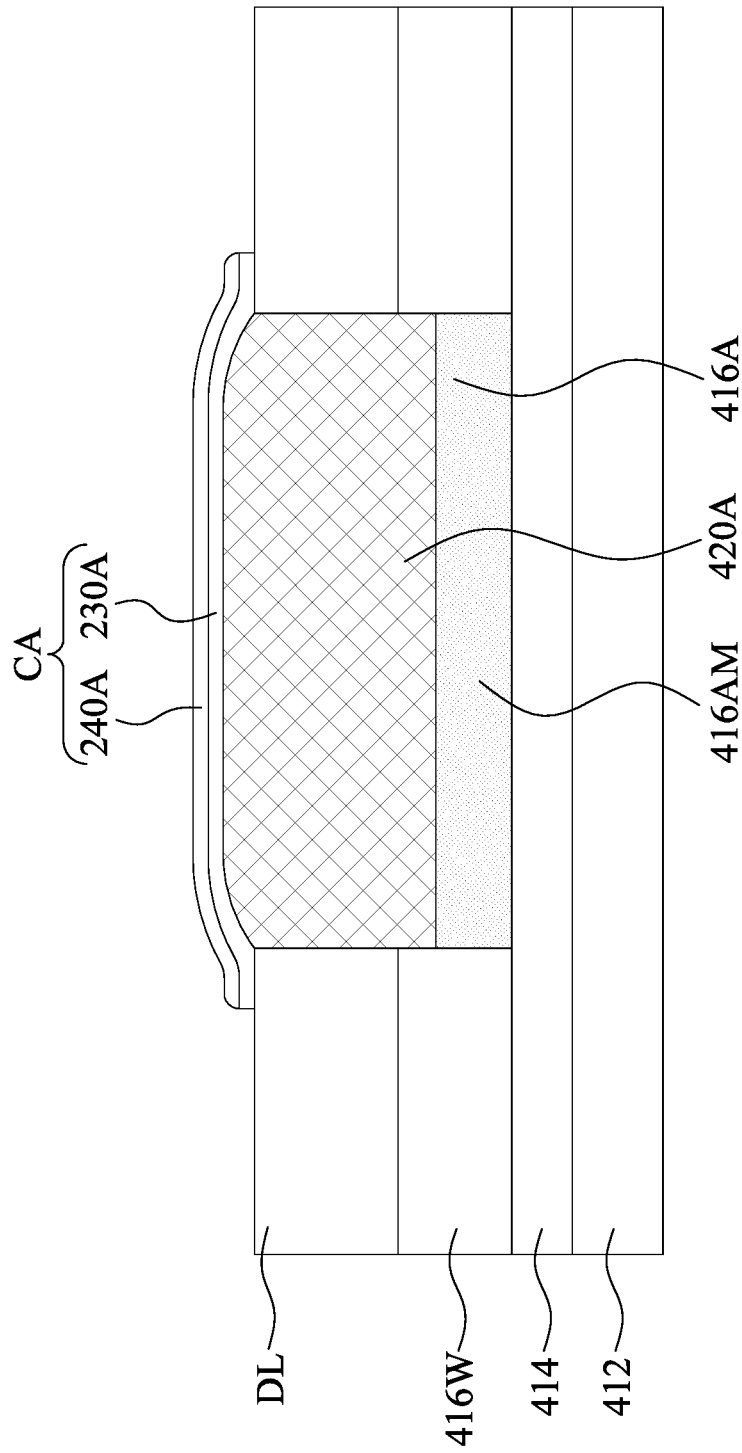
Figure 9D:
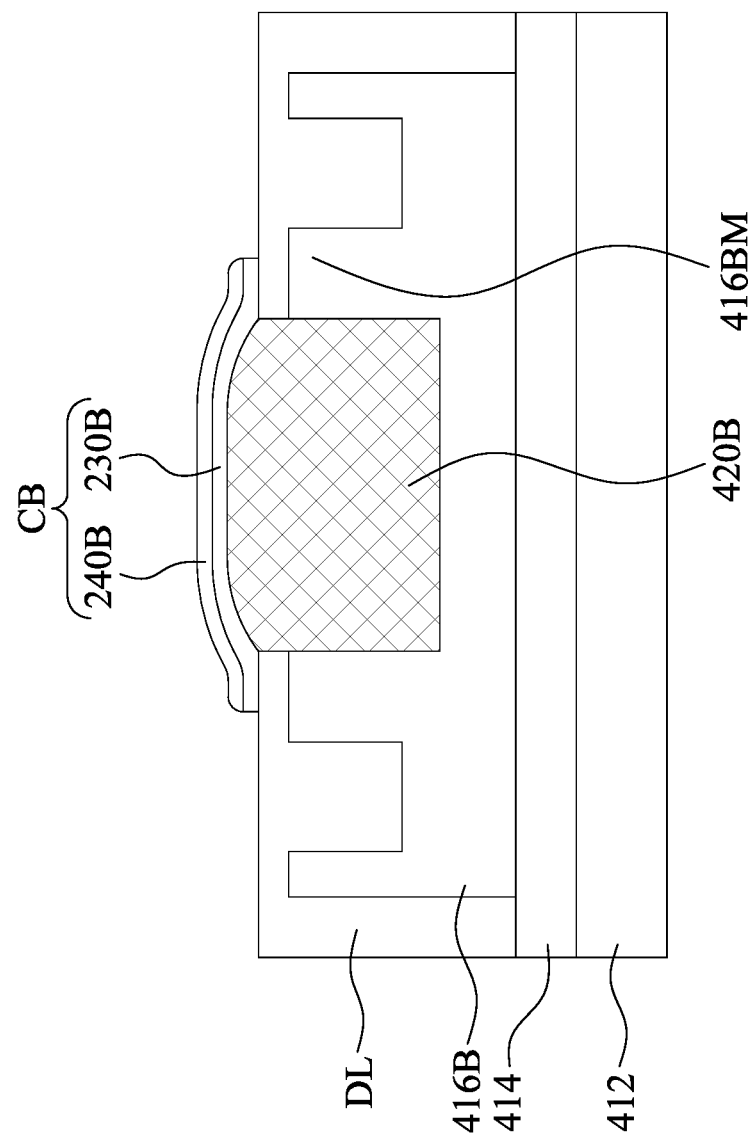
Figure 9E:
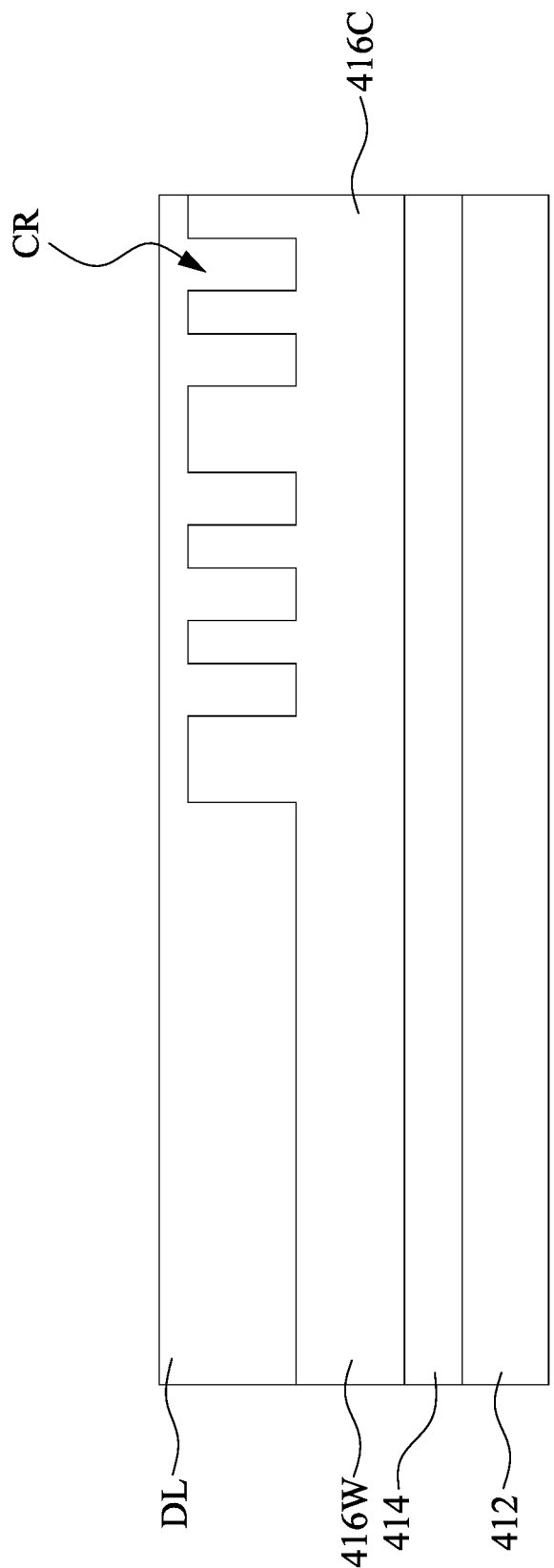
Figure 10A:
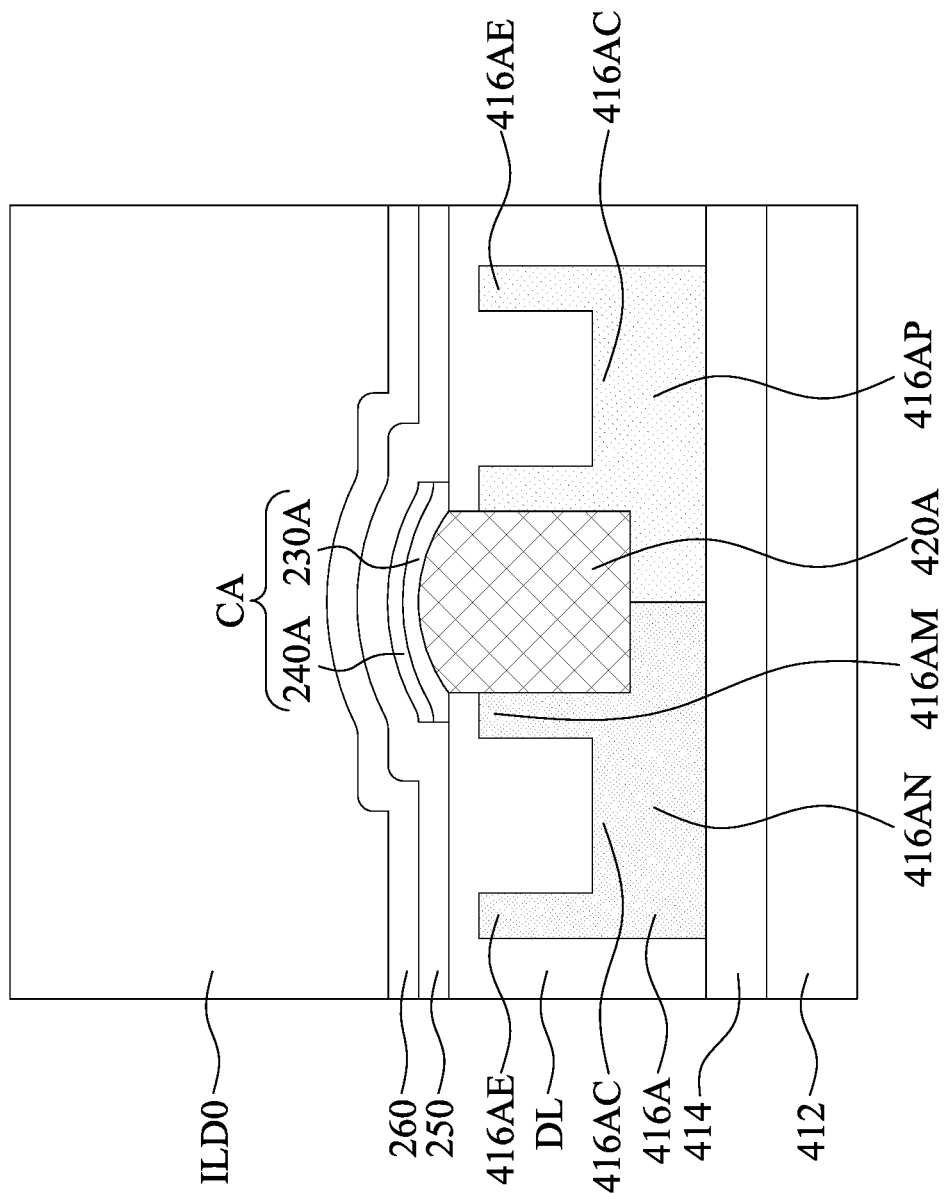
Figure 10B:
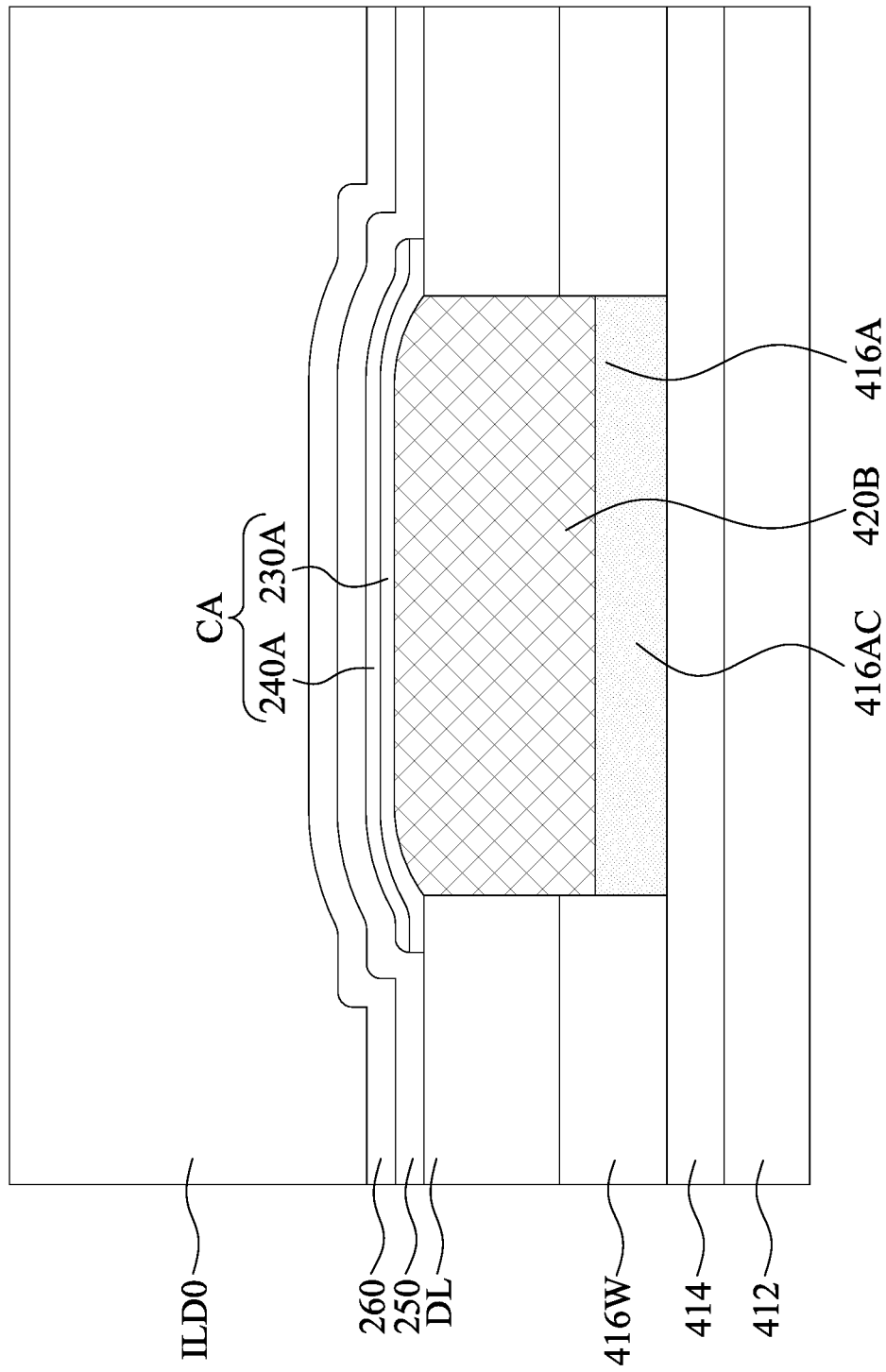
Figure 10C:
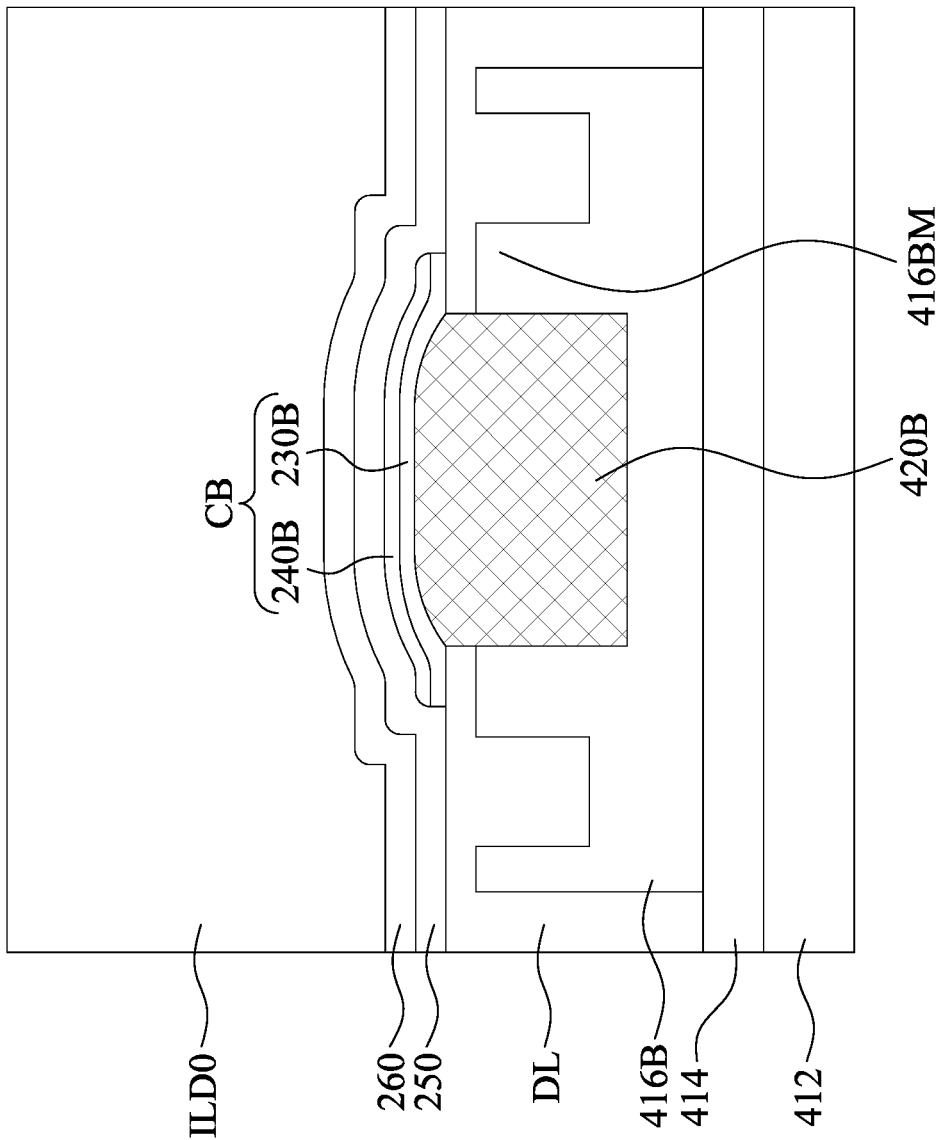
Figure 10D:
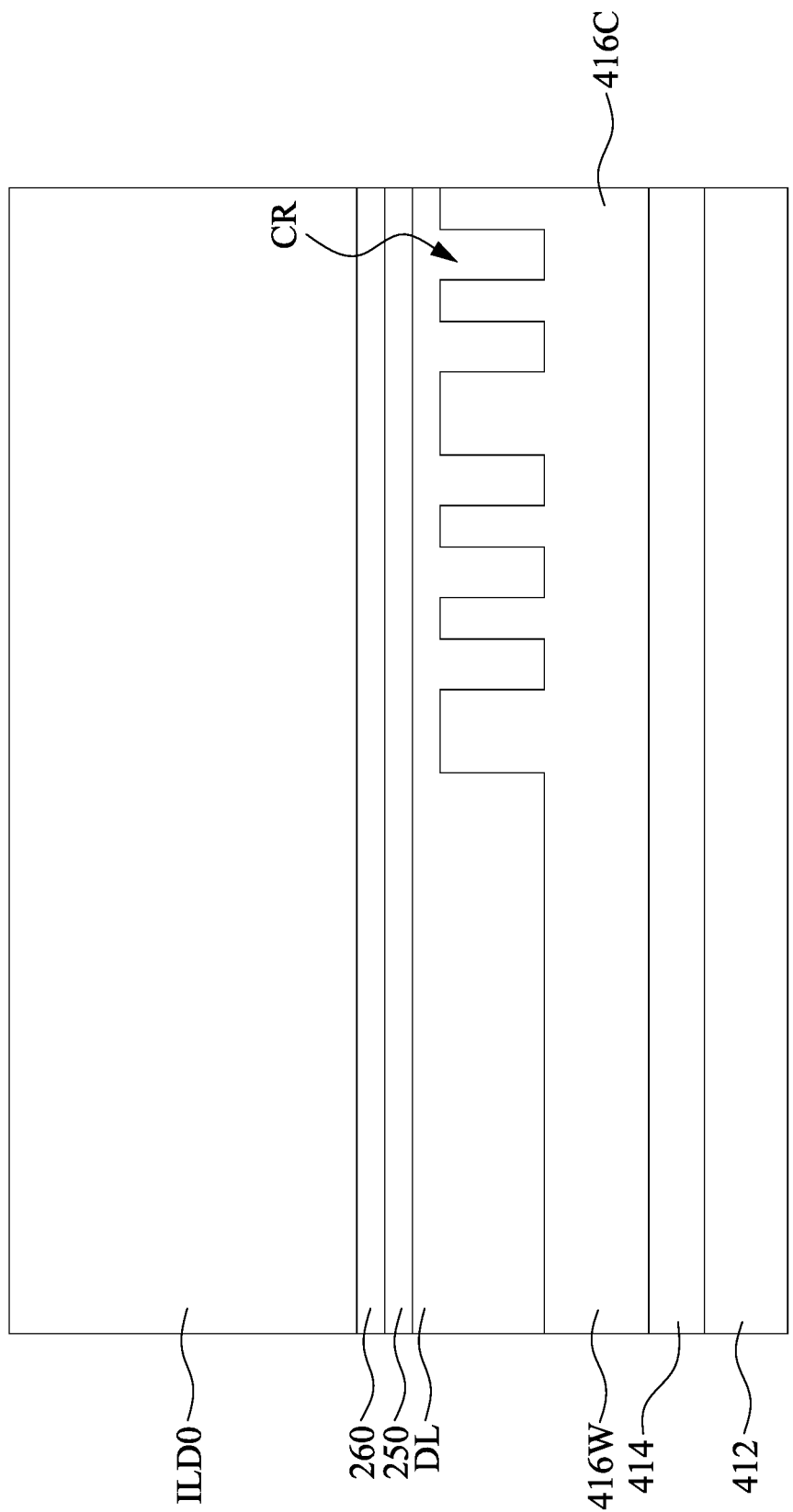

Reference is made to FIGS. 9A-9E. FIG. 9A is a top view of a photonic device 100 at an intermediate stage of manufacture according to some embodiments of the present disclosure. FIG. 9B is a cross-sectional view taken along line B-B in FIG. 9A. FIG. 9C is a cross-sectional view taken along line C-C in FIG. 9A. FIG. 9D is a cross-sectional view taken along line D-D in FIG. 9A. The first capping film 230 and the second capping film 240 (referring to FIGS. 8A-8D) are patterned into first capping layers 230A and 230B and second capping layers 240A and 240B, respectively over the semiconductor features 420A and 420B. For example, a mask layer (e.g., photoresist layer, not shown) may be formed over the first capping film 230 and the second capping film 240 (referring to FIGS. 8A-8D) and patterned by suitable photolithography process. Subsequently, one or more etching processes are performed to the first capping film 230 and the second capping film 240 (referring to FIGS. 8A-8D) through the patterned mask layer (not shown), thereby removing portions of the first capping film 230 and the second capping film 240 (referring to FIGS. 8A-8D) uncovered by the patterned mask layer (not shown). Other portions of the first capping film 230 and the second capping film 240 (referring to FIGS. 8A-8D) covered by the patterned mask layer (not shown) remain after the etching process and form the first capping layers 230A and 230B and second capping layers 240A and 240B.

The first capping layer 230A and the second capping layer 240A in combination may be referred to as a composite capping layer CA in some embodiments. The composite capping layer CA may protect the semiconductor feature 420A from contamination or damages in subsequent processes (e.g., wet etch process, wet clean process, silicide process, or the like). Similarly, the first capping layer 230B and the second capping layer 240B in combination may be referred to as a composite capping layer CB in some embodiments. The composite capping layer CB may protect the semiconductor feature 420B from contamination or damages in subsequent processes (e.g., wet etch process, wet clean process, silicide process, or the like).

In the absence of the second capping layer 240A and 240B, the first capping layers 230A and 230B over the semiconductor features 420A and 420B may crack due to uneven topography of the underlying structure, resulting crevices in the first capping layers 230A and 230B. The liquid used in subsequent wet etch process, wet clean process (e.g., during the formation of contact openings), or silicide process may reach the semiconductor features 420A and 420B through the crevices in the first capping layers 230A and 230B and damage the semiconductor features 420A and 420B.

In the embodiments of the present disclosure, the second capping layer 240A and 240B are formed over the first capping layers 230A and 230B, thereby sealing the first capping layers 230A and 230B. The second capping layer 240A and 240B may fill the crevices in the first capping layers 230A and 230B. Furthermore, having a higher oxide concentration, the second capping layers 240A and 240B are less rigid than the first capping layers 230A and 230B are, such that the uneven topography of the underlying structure result in less cracks in the second capping layers 240A and 240B than the cracks in the first capping layers 230A and 230B. Through the configuration of the composite capping layers CA and CB, the liquid used in the subsequent processes may not reach the semiconductor features 420A and 420B, and the semiconductor features 420A and 420B are protected from being damaged.

Since the first capping layer 230A and the second capping layer 240A are made of different materials (e.g., having different oxide concentrations), the first capping layer 230A and the second capping layer 240A may have a clear interface therebetween. Similarly, since the first capping layer 230B and the second capping layer 240B are made of different materials (e.g., having different oxide concentrations), the first capping layer 230B and the second capping layer 240B may also have a clear interface therebetween.

In some embodiments, through the patterning process, a part of the semiconductor structure 416A is not covered by the composite capping layer CA, and a part of the semiconductor structure 416B is not covered by the composite capping layer CB. For example, the composite capping layer may not extend beyond the edges of the middle raising portion 416AM, and the composite capping layer CB may not extend beyond the edges of the middle raising portion 416BM. In some other embodiments, the composite capping layers CA and CB may extend beyond the edges of the middle raising portion 416AM and 416BM, respectively. In some embodiments, through the patterning process, portions of the first capping film 230 and the second capping film 240 (referring to FIGS. 8A-8D) over the waveguide structures 416W and the coupler structure 416C are removed.

Reference is made to FIGS. 10A-10D. FIGS. 10A-10D are cross-sectional views taken along the same line as that of FIGS. 9A-9D. A resist protection oxide (RPO) film 250 is conformally formed over the first capping layers 230A and 230B. Then, an interlayer dielectric (ILD) layer ILD0 is formed over the RPO film 250. In some embodiments, the ILD layer ILD0 may include an oxide (e.g., $SiO_2$), an ultra-low k dielectric material, a low-k dielectric material (e.g., SiCO), or the like. The ILD layer ILD0 may be an un-doped silicate glass (USG) or fluorosilicate glass (FSG) layer. In some embodiments, the ILD layer ILD0 may be formed by a vapor deposition process. In some embodiments, prior to the formation of the ILD layer ILD0, an etch stop layer 260 is conformally formed over the structure of FIGS. 9A-9D. The etch stop layer 260 may include suitable material different from that of the ILD layer ILD0 and the RPO film 250. For example, in the present embodiments, the etch stop layer 260 may include silicon nitride, silicon oxynitride, silicon carbide, or the like.

Figure 11:
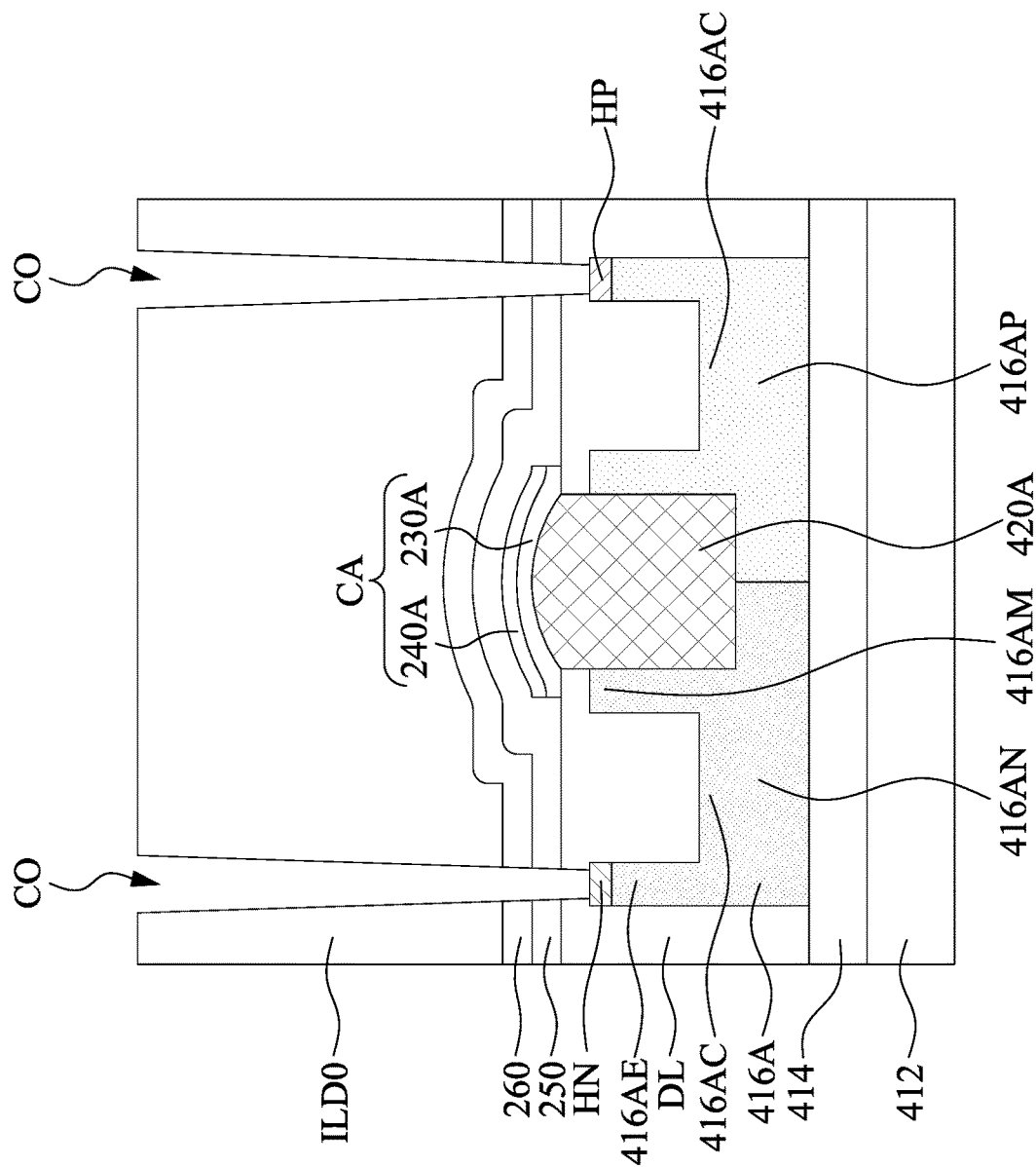

Reference is made to FIG. 11. FIG. 11 is a cross-sectional view taken along the same line as that of FIG. 10A. The ILD layer ILD0, the etch stop layer 260, and the RPO film 250 are etched to form contact openings CO exposing portions of the first doped region 416AN and the second doped region 416AP (e.g., edge portions 416AE), respectively. Plural implantation processes may be performed to the exposed portions of the first doped region 416AN and the second doped region 416AP through the contact openings CO, thereby forming highly doped contact regions HN and HP in the first doped region 416AN and the second doped region 416AP, respectively. In some embodiments, the highly doped contact region HN has the first conductive type (e.g., n-type). For example, the dopants implanted into the highly doped contact region HN may be n-type dopants, such as phosphorous, arsenic, antimony, or the like. In some embodiments, the highly doped contact region HP has the second conductive type (e.g., p-type). For example, the dopants implanted into the highly doped contact region HP may be p-type dopants, such as boron, gallium, indium, or the like.

Figure 12A:
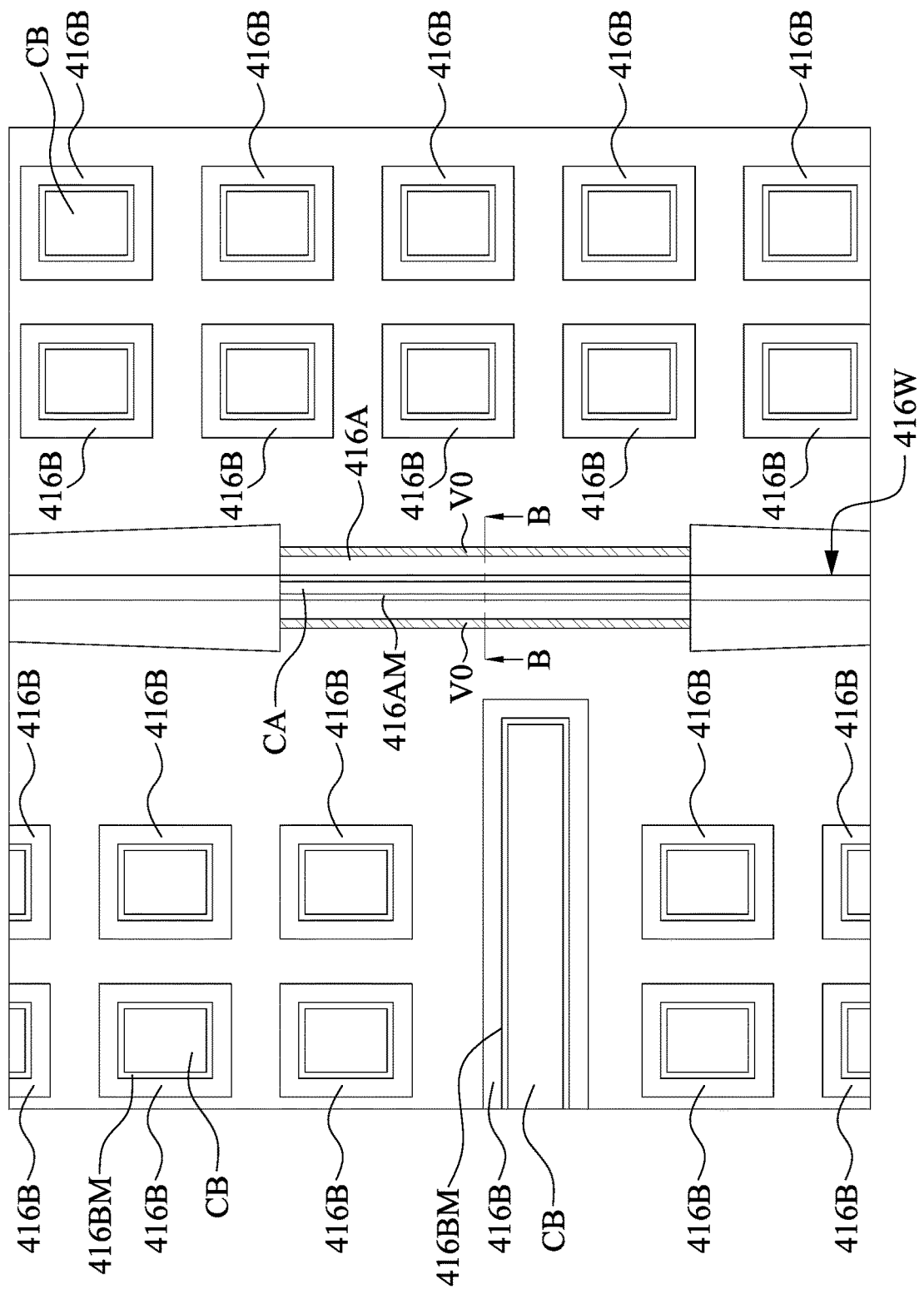
Figure 12B:
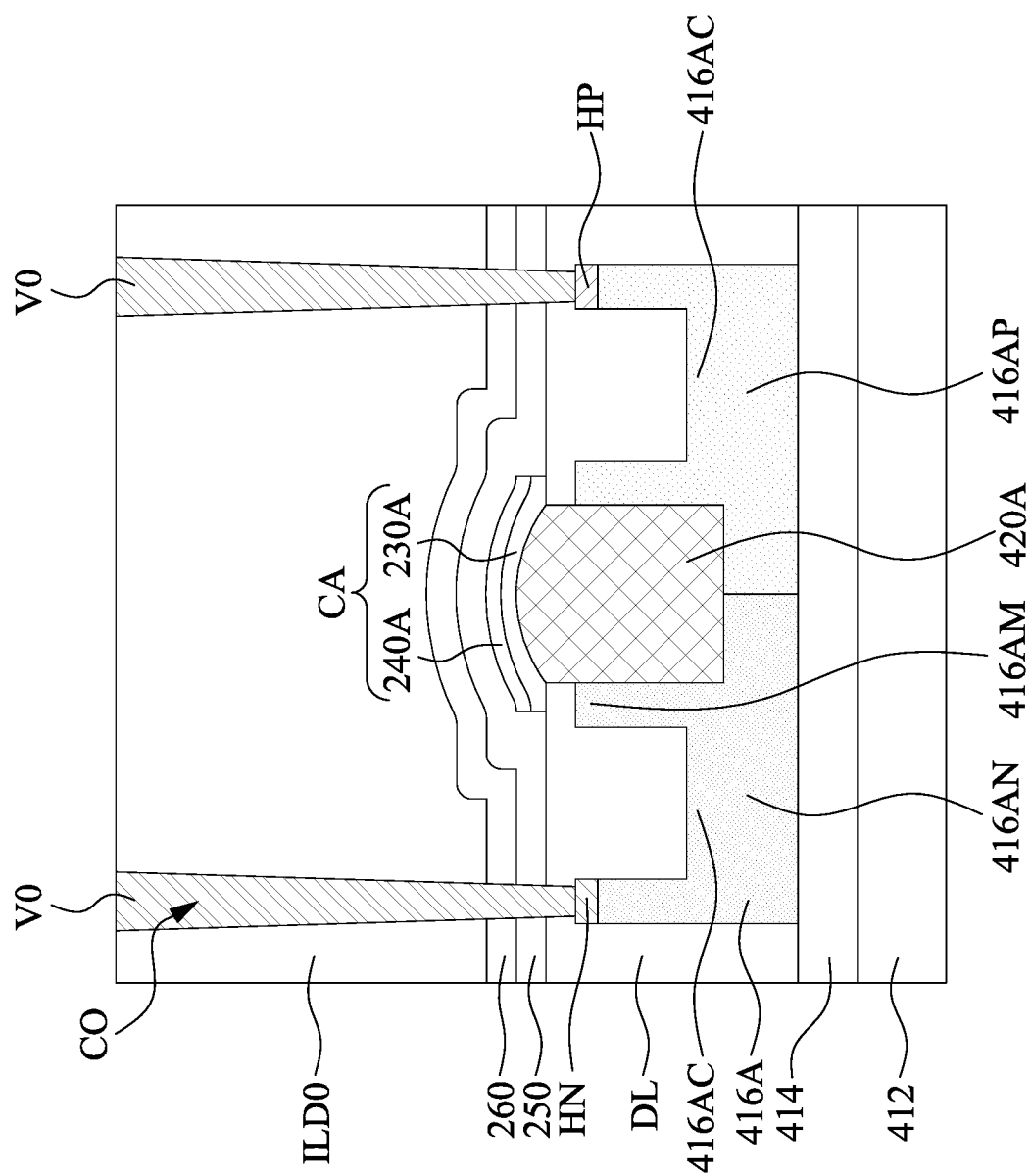
Figure 13A:
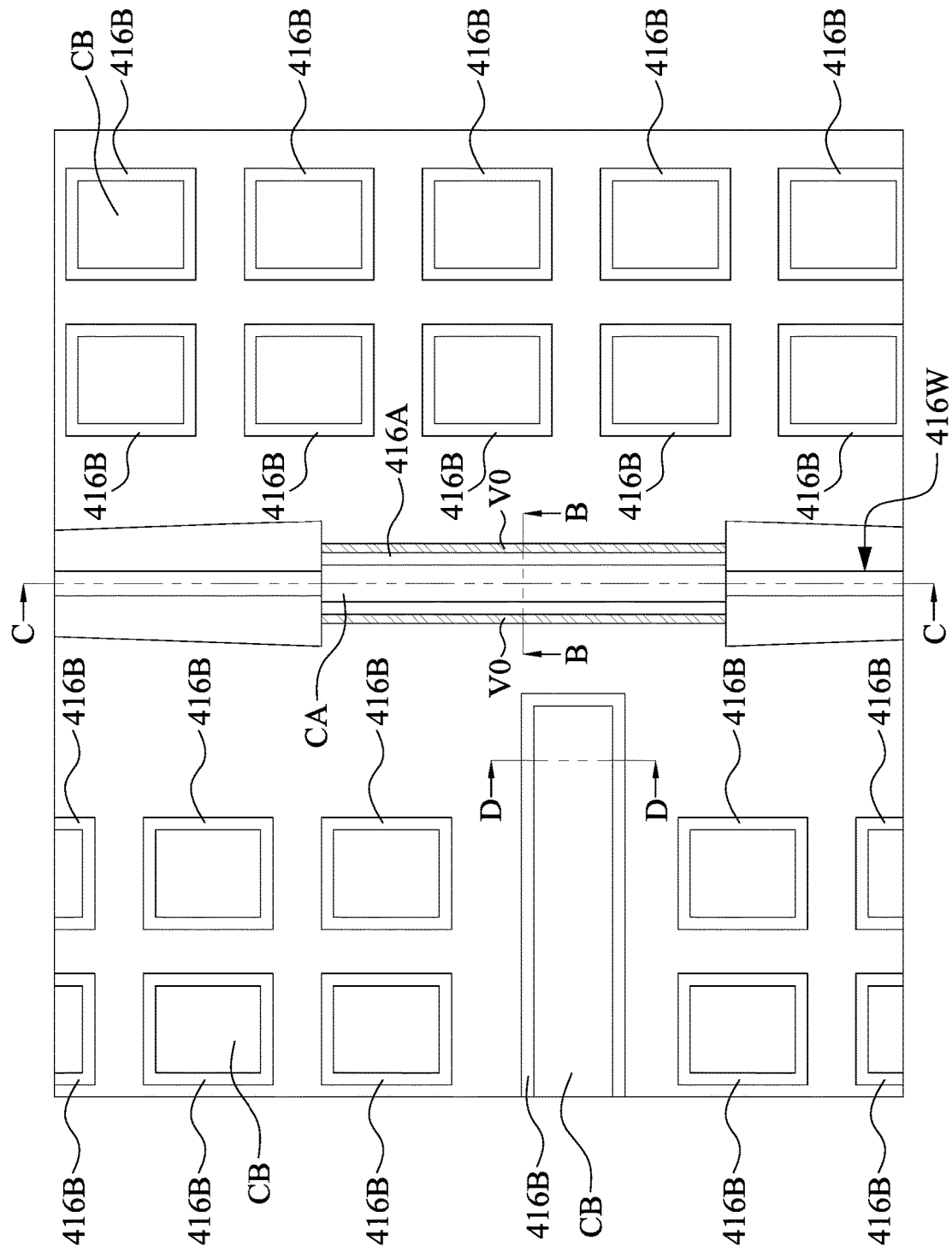
FIGS. 13A-13D illustrate a photonic device according to some embodiments of the present disclosure.
Figure 13B:
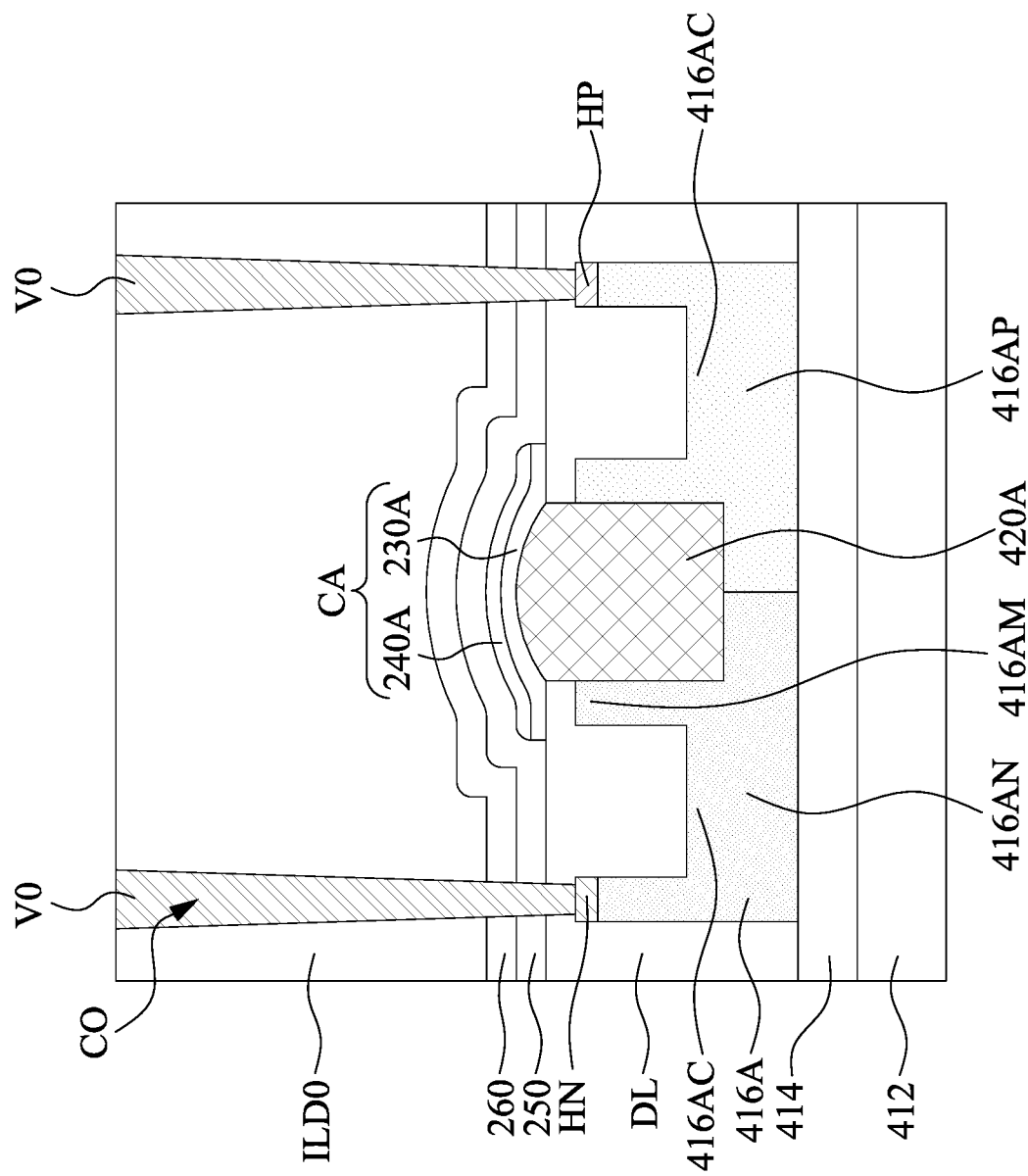
Figure 13C:
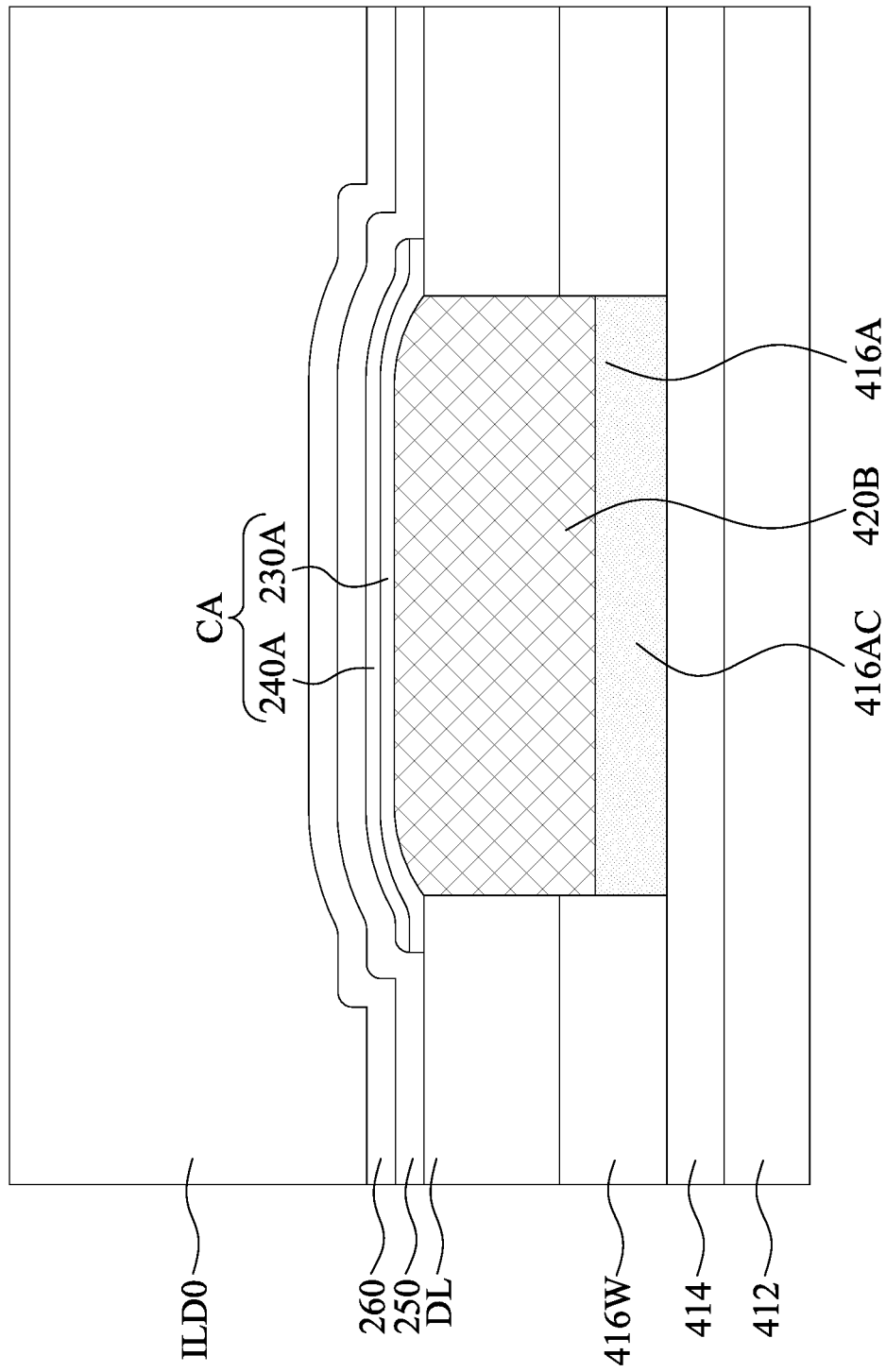
Figure 13D:
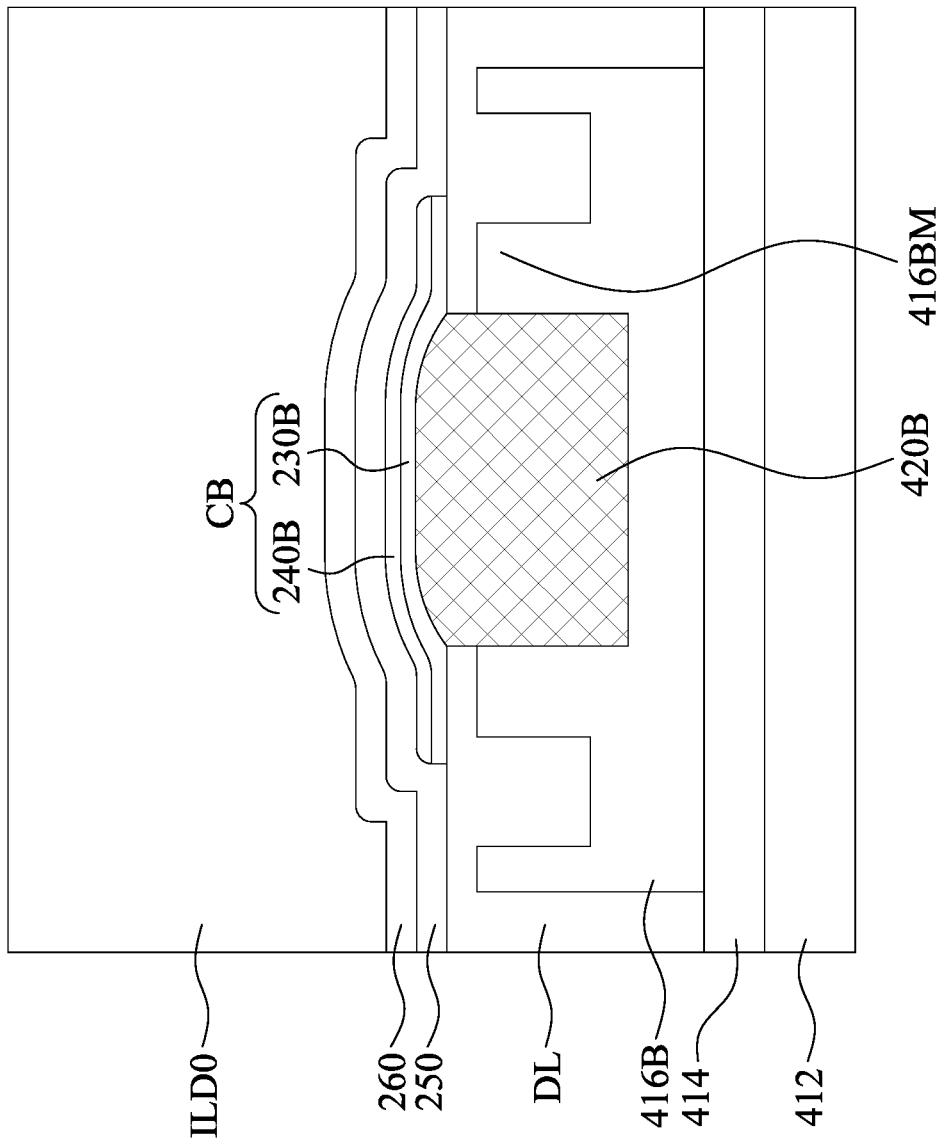

Reference is made to FIGS. 12A-12B. FIG. 12A is a top view of a photonic device 100 at an intermediate stage of manufacture according to some embodiments of the present disclosure. FIG. 12B is a cross-sectional view taken along line B-B in FIG. 12A. Conductive contacts V0 are formed in the contact openings CO to connect the first doped region 416AN and the second doped region 416AP. The highly doped contacts HN and HP in the first doped region 416AN and the second doped region 416AP may improve the ohmic contacts between the conductive contacts V0 and the semiconductor structure 416A.

For example, the contact openings CO are filled with one or more conductive materials. In some embodiments, the one or more conductive materials may include tungsten (W), aluminum (Al), titanium (Ti), titanium nitride (TiN), and/or tantalum nitride (TaN). In some embodiments, a diffusion barrier layer and/or a liner layer may be deposited into the contact openings prior to depositing the one or more conductive materials. In some embodiments, the one or more conductive materials may be deposited by way of a vapor deposition technique (e.g., CVD, PVD, plasma-enhanced CVD (PE-CVD), etc.) and/or a plating process (e.g., an electroplating or electro-less plating process). After filling the contact openings CO with the conductive materials, a planarization process (e.g., CMP process) may be performed to remove a portion of the conductive materials out of the contact openings CO.

In some embodiments of the present disclosure, the structure 416A and the semiconductor features 420A over the structure 416A forms a photodetector (e.g., the photodetector 310 in FIG. 1). In some embodiments, the waveguide structure 416W surrounded by the dielectric layer DL forms a waveguide (e.g., the waveguides WG in FIG. 1). In some embodiments, the coupler structure 416C is surrounded by the dielectric layer DL forms an optical coupler (e.g., the optical coupler CG0-CG2 in FIG. 1).

FIGS. 13A-13D illustrate a photonic device according to some embodiments of the present disclosure. The present embodiments are similar to those shown in FIGS. 10A-12B, and at least one difference between the present embodiments and the embodiments of FIGS. 10A-12B is that the composite capping layer CA extends beyond the edges of the middle raising portion 416AM of the structure 416A, and the composite capping layer CB extends beyond the edges of the middle raising portion 416BM of the dummy structure 416B. For example, the mask layer (e.g., photoresist layer, not shown) used in patterning the first capping film 230 and the second capping film 240 (referring to FIG. 8A-9E) may cover the entire top surface of the middle raising portions 416AM and 416BM, such that the formed composite capping layer CA (e.g., the layers 230A and 240A) covers the entire top surface of the middle raising portion 416AM, and the formed composite capping layer CB (e.g., the layers 230B and 240B) covers the entire top surface of the middle raising portion 416BM. Other details of the present embodiments are similar to those mentioned in the embodiments of FIGS. 10A-12B, and therefore not repeated herein.

Figure 14:
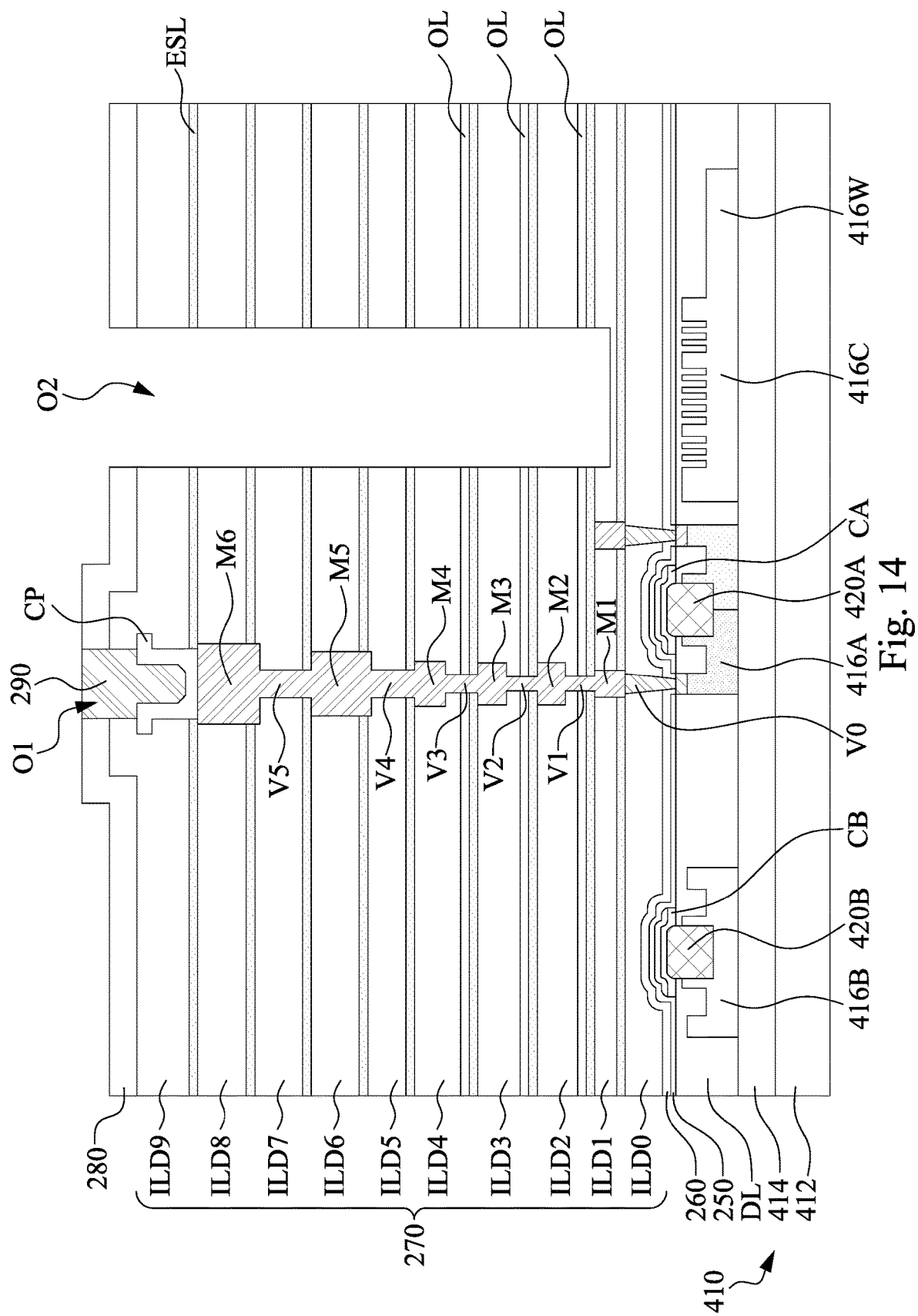
FIG. 14 is a schematic cross-sectional view of a photonic device according to some embodiments of the present disclosure.

FIG. 14 is a schematic cross-sectional view of a photonic device according to some embodiments of the present disclosure. A metallization pattern 270 is formed over the structure of FIGS. 12A-12B or the structure of FIGS. 13A-13D, and connecting the conductive contacts V0. The metallization pattern 270 includes plural ILD layers ILD1-ILD9, plural metal layers M1-M6, and plural metal vias V1-V5. In some embodiments, the ILD layers ILD1-ILD9 may include an oxide (e.g., $SiO_2$), an ultra-low k dielectric material, a low-k dielectric material (e.g., SiCO), or the like. The ILD layers ILD1-ILD9 may include un-doped silicate glass (USG), hard black diamond (HBD), fluorosilicate glass (FSG), or the like. The metal layers M1-M6 and the metal vias V1-V5 are in the ILD layers ILD1-ILD9, in which each of the metal vias V1-V5 is connected between the two adjacent metal layers M1-M6. In some embodiments, the metal layers M1-M6 and the metal vias V1-V5 may include suitable metallic material such as aluminum, aluminum alloy, copper, copper alloy, titanium, titanium nitride, tantalum, tantalum nitride, tungsten, the like, and/or combinations thereof. Formation of the metallization pattern 270 may be a dual-damascene process and/or a single-damascene process. Although the exemplary embodiments described herein depict six metal layers and five metal vias, this is merely illustrative and it should be understood that the photonic device may alternatively be formed with more or fewer metal layers and metal vias, depending on the application.

In some embodiments, etch stop layers ESL may be formed between two adjacent ILD layers ILD1-ILD9 for protecting the underlying material from being etched when etching trenches or vias for the formation of the metal layers M1-M6 and the metal vias V1-V5. The etch stop layers ESL may include suitable material other than that of the ILD layers ILD1-ILD9. For example, the etch stop layers ESL may include silicon carbide, silicon nitride, silicon oxynitride, the combination thereof, or the like. Oxide layers (e.g., tetraethoxysilane (TEOS) layers) OL may optionally formed over the etch stop layers ESL in some embodiments.

After the formation of the metallization pattern, a passivation layer 280 is formed over the ILD layer ILD9, and an opening O1 is then etched in the passivation layer 280 and the ILD layer ILD9. Subsequently, a conductive feature 290 is formed in the opening O1 to connect the metal layer M6. The conductive feature 290 may include suitable conductive materials, such as aluminum. The conductive feature 290 may be a connector, such as conductive bumps, solder balls, etc. In some embodiments, prior to the formation of the conductive feature 290, a contact pad CP is formed over the metal layer M6. The contact pad CP may include suitable conductive materials, such as copper, aluminum, the combination thereof, or the like. The conductive feature 290 may be electrically connected to the metal layer M6 through the contact pad CP. Through the conductive feature 290, electrical components (not shown), such as dies, may be electrically connected to the metal layer M6.

Above the coupler structure 416C, an opening O2 is formed to penetrate through the ILD layers ILD1-ILD9. In some embodiments, the opening O2 may be used as a light path or waveguide to introduce light to the coupler structure 416C. In some embodiments, the opening O2 has a rectangular profile with two parallel sidewalls perpendicular to a top surface of the semiconductor substrate 410. In some other embodiments, the opening O2 has a tapered profile, in which a width at a top of the opening O2 is wider than a width at a bottom of the opening O2.

Figure 15B:
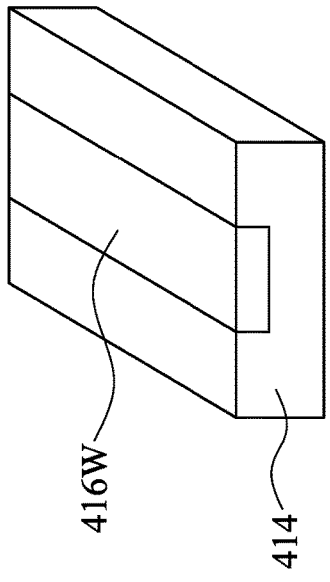
FIGS. 15A-15D illustrates schematic perspective views of a waveguide according to various embodiments of the present disclosure.
Figure 15D:
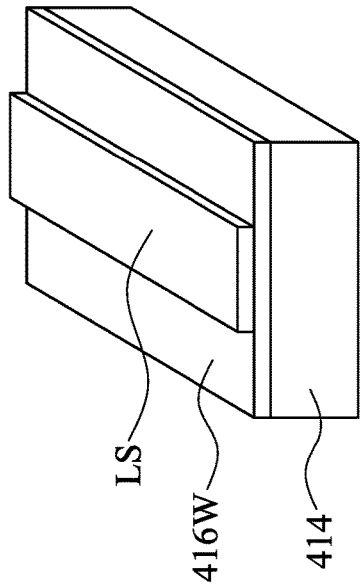
Figure 15A:
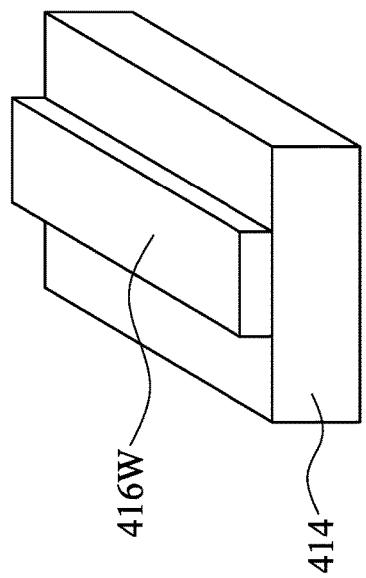

FIGS. 15A-15D illustrates schematic perspective views of a waveguide WG of FIG. 1 according to various embodiments of the present disclosure. Referring to FIG. 15A, as illustrated in FIG. 3F, the waveguide WG may has a strip waveguide structure 416W on top of an insulator layer 414. The waveguide structure 416W has a higher refractive index than a refractive index of the insulator layer 414 and therefore acts as the waveguiding core. The strip waveguide structure 416W has strong optical confinement because it is surrounded by the insulator layer 414 and a low-index material (e.g., the air, the dielectric layer DL in FIG. 14, or other cladding materials).

Referring to FIG. 15B, in the present embodiments, the waveguide WG may has a waveguide structure 416W buried in the insulator layer 414. The strip waveguide structure 416W has a strong optical confinement because it is surrounded on three sides by the insulator layer 414.

Figure 15C:
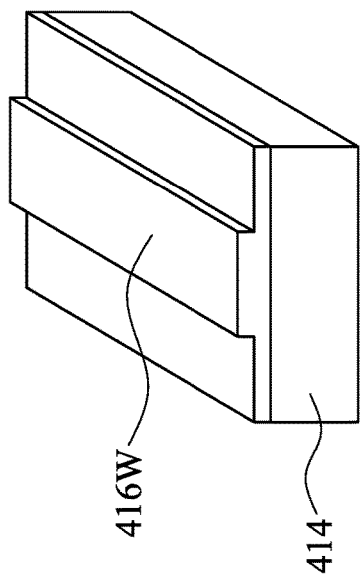

Referring to FIG. 15C, in present embodiments, the waveguide WG may has a rib or ridge waveguide structure 416W. The rib or ridge waveguide structure 416W has the same index as the high index planar layer beneath it and is part of the waveguiding core.

Referring to FIG. 15D, in present embodiments, the waveguide WG may be a strip-loaded waveguide formed by loading a planar waveguide structure 416W with a loading strip LS. The planar waveguide structure 416W provides optical confinement in the vertical direction. The loading strip LS may be a dielectric strip with a refractive index less than the refractive index of the waveguide structure 416W, or a metal strip to facilitate optical confinement in the horizontal direction. The waveguiding core of a strip-loaded waveguide WG is a region of the waveguide structure 416W under the loading strip LS.

Based on the above discussions, it can be seen that the present disclosure offers advantages to the photonic device including semiconductor photodiodes. It is understood, however, that other embodiments may offer additional advantages, and not all advantages are necessarily disclosed herein, and that no particular advantage is required for all embodiments. One advantage is that the first capping layer (e.g., nitride capping layer) over the epitaxial semiconductor feature is sealed by the second capping layer (e.g., oxide capping layer) thereon, such that the epitaxial semiconductor feature is protected from contamination in subsequent processes. Another advantage is that the second capping layer over the first capping layer is less rigid than the second capping layer, such that the composite capping layer including the first and second capping layers has reduced crevices, which in turn will protect the underlying epitaxial semiconductor feature from liquid used in subsequent processes.

According to some embodiments of the present disclosure, a method for fabricating a photonic device is provided. The method includes patterning a semiconductor layer to form a waveguide structure, a semiconductor structure connected to the waveguide structure, and a dummy semiconductor structure disconnected from the waveguide structure and the semiconductor structure; epitaxially growing an epitaxial semiconductor feature over the semiconductor structure and a dummy epitaxial semiconductor feature over the dummy semiconductor structure; depositing a first capping film over the epitaxial semiconductor feature and the dummy epitaxial semiconductor feature; depositing a second capping film over the first capping film, wherein an oxide concentration of the second capping film is greater than an oxide concentration of the first capping film; and patterning the first and second capping films to form at least a dummy composite capping layer over the dummy epitaxial semiconductor feature.

According to some embodiments of the present disclosure, a method for fabricating a photonic device is provided. The method includes patterning a semiconductor layer to form a first semiconductor structure having a first portion, a second portion, and a middle portion between the first and second portion; epitaxially growing an epitaxial semiconductor feature over the middle portion of the first semiconductor structure; forming a composite capping layer over the epitaxial semiconductor feature, wherein the composite capping layer comprises a first capping layer and a second capping layer over the first capping layer, and the second capping layer has a material different from that of the first capping layer.

According to some embodiments of the present disclosure, a photonic device includes a semiconductor structure, an epitaxial semiconductor feature, and a composite capping layer. The epitaxial semiconductor feature is over the semiconductor structure. The composite capping layer is over a top surface of the epitaxial semiconductor feature. The composite capping layer includes a first capping layer and a second capping layer over the first capping layer, and an oxide concentration of the second capping layer is greater than an oxide concentration of the first capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a photonic device, comprising:
    patterning a semiconductor layer to form a waveguide structure, a semiconductor structure connected to the waveguide structure, and a dummy semiconductor structure disconnected from the waveguide structure and the semiconductor structure;
    epitaxially growing an epitaxial semiconductor feature over the semiconductor structure and a dummy epitaxial semiconductor feature over the dummy semiconductor structure;
    depositing a first capping film over the epitaxial semiconductor feature and the dummy epitaxial semiconductor feature;
    depositing a second capping film over the first capping film, wherein an oxide concentration of the second capping film is greater than an oxide concentration of the first capping film; and
    patterning the first and second capping films to form at least a dummy composite capping layer over the dummy epitaxial semiconductor feature.

2. The method of claim 1, wherein patterning the first and second capping films further forms a composite capping layer over the epitaxial semiconductor feature.

3. The method of claim 1, further comprising:
    forming a dielectric layer covering the waveguide structure prior to epitaxially growing the epitaxial semiconductor feature and the dummy epitaxial semiconductor feature.

4. The method of claim 3, wherein forming the dielectric layer is performed such that the dielectric layer exposes a portion of the semiconductor structure and a portion of the dummy semiconductor structure.

5. The method of claim 3, wherein epitaxially growing the epitaxial semiconductor feature and the dummy epitaxial semiconductor feature is performed such that the epitaxial semiconductor feature and the dummy epitaxial semiconductor feature protrude from the dielectric layer.

6. The method of claim 3, wherein patterning the first capping film and the second capping film into the dummy composite capping layer is performed such that the dummy composite capping layer is in contact with the dielectric layer.

7. The method of claim 1, wherein patterning the semiconductor layer further forms a coupler structure optically coupled to the semiconductor structure through the waveguide structure.

8. The method of claim 1, further comprising:
    performing an ion implantation process to the semiconductor structure prior to epitaxially growing the epitaxial semiconductor feature and the dummy epitaxial semiconductor feature.

9. A method for fabricating a photonic device, comprising:
    patterning a semiconductor layer to form a first semiconductor structure having a first portion, a second portion, and a middle portion between the first and second portion;
    epitaxially growing an epitaxial semiconductor feature over the middle portion of the first semiconductor structure; and
    forming a composite capping layer over and in contact with the epitaxial semiconductor feature, wherein the composite capping layer comprises a first capping layer and a second capping layer over the first capping layer, and the second capping layer has a material different from that of the first capping layer.

10. The method of claim 9, wherein an oxide concentration of the second capping layer is greater than an oxide concentration of the first capping layer.

11. The method of claim 9, wherein the epitaxially growing the epitaxial semiconductor feature is performed when the first semiconductor structure is undoped.

12. The method of claim 9, wherein patterning the semiconductor layer further forms a second semiconductor structure, the method further comprising:
    doping the second semiconductor structure prior to epitaxially growing the epitaxial semiconductor feature.

13. The method of claim 9, wherein forming the composite capping layer is performed such that an oxide concentration of the second capping layer is greater than an oxide concentration of the first capping layer.

14. The method of claim 9, further comprising:
    etching a recess in the middle portion of the first semiconductor structure prior to epitaxially growing the epitaxial semiconductor feature.

15. The method of claim 9, further comprising:
    forming a dielectric layer covering the first portion and the second portion of the first semiconductor structure prior to epitaxially growing the epitaxial semiconductor feature.

16. A photonic device, comprising:
    a semiconductor structure;
    an epitaxial semiconductor feature over the semiconductor structure; and
    a composite capping layer over a top surface of the epitaxial semiconductor feature, wherein the composite capping layer comprises a first capping layer and a second capping layer over the first capping layer, and an oxide concentration of the second capping layer is greater than an oxide concentration of the first capping layer.

17. The photonic device of claim 16, wherein the semiconductor structure is undoped.

18. The photonic device of claim 16, wherein the top surface of the epitaxial semiconductor feature protrudes upward.

19. The photonic device of claim 18, further comprising:
    a dielectric layer covering the semiconductor structure and surrounding the epitaxial semiconductor feature, wherein the top surface of the epitaxial semiconductor feature protrudes from a top surface of the dielectric layer.

20. The photonic device of claim 16, wherein the epitaxial semiconductor feature is at least partially in a recess of the semiconductor structure.

* * * * *